United States Patent [19]
Elmore et al.

[11] Patent Number: 5,978,741
[45] Date of Patent: Nov. 2, 1999

[54] VACUUM FIXTURE

[76] Inventors: David D. Elmore, 78 Stackpole Rd., Somersworth, N.H. 03878; Daniel A. Staver, 28 Glen Ter., Scotia, N.Y. 12302; Jeffrey W. Mammen, 9D Talcott Ridge Rd., Farmington, Conn. 06032

[21] Appl. No.: 08/872,035

[22] Filed: Apr. 9, 1997

Related U.S. Application Data

[62] Division of application No. 08/564,543, Nov. 30, 1995.

[51] Int. Cl.$^6$ .................................................. G01R 25/00
[52] U.S. Cl. .............................................. 702/60; 702/79
[58] Field of Search .................................. 702/64, 65, 79, 702/190, 198, 72, 76, 77, 60; 364/528.21; 324/76.52, 76.39, 76.77, 86

[56] References Cited

U.S. PATENT DOCUMENTS

| | | | |
|---|---|---|---|
| 4,131,847 | 12/1978 | Kohga et al. | 324/141 |
| 4,454,471 | 6/1984 | Schwendtner et al. | 324/141 |
| 4,937,520 | 6/1990 | Arseneau et al. | 324/77.11 |
| 5,198,751 | 3/1993 | Nakamura | 324/141 |
| 5,229,713 | 7/1993 | Bullock et al. | 324/142 |
| 5,243,536 | 9/1993 | Bradford | 702/60 |
| 5,657,237 | 8/1997 | Mazzoni | 702/60 |

FOREIGN PATENT DOCUMENTS

| | | |
|---|---|---|
| WO 93/17345 | 2/1992 | WIPO . |
| WO 93/17390 | 2/1992 | WIPO . |

OTHER PUBLICATIONS

Curtis et al., *Definitions of Power and Related Quantities*, A.I.E.E. Summer Convention, Ithaca, New York, Jun. 24–28, 1935.

Bullock et al., *MinD Ur Ps & Qs: Four Powers, Computed from Voltages and Currents Under IEEE Std–100, Meet Rational Metering Requirements*, EEI–AEIC Meter and Service Committee meeting, Fairmont Hotel–Dallas, Texas, Mar. 27–30, 1994.

Mack, *Function Spaces and Fourier Series*, Chapter 15, The General Electric A Course Engineering Analysis, pp. 366–373.

Rosenau, Phasor, *Apparent and Arithmetic Apparent AC Power*, GE Meter Department Technote–03, Jun. 8, 1994.

Bullock et al., *Measurement of Polyphase Reactive Power*, GE Meter Department, Aug. 1993.

Bullock et al., *An Analysis of a Sampling A.C. Wanhour Meter*, GE Meter Department, Technote–06, Apr. 1994.

IEEE, *IEEE Standard Dictionary of Electrical and Electronics Terms, Fourth Edition*, 1988, pp. 21, 47, 281, 550–551, 690, 729, 730, 791.

*Primary Examiner*—John Barlow
*Assistant Examiner*—Craig Steven Miller

[57] ABSTRACT

Line voltage and line current signals are sensed on a power line having at least one conducting path. The sensed line voltages and line currents are converted into a digital signal. A phase-to-neutral voltage signal and phase current signal are computed from the digital signal to thereby define a phase of the power line. An interval of orthogonality is determined from the sensed voltage and current signals, coinciding with passage of an integral number of cycles of a fundamental frequency reference signal which is computed from the computed phase-to-neutral voltage signal. A vector metering quantity is computed for the determined interval of orthogonality from the computed phase-to-neutral voltage signal and the computed phase current signal. The vector metering quantities to be computed may be identified and computed based upon an associated detent. The vector metering quantity is also computed based on an identified circuit topology.

5 Claims, 20 Drawing Sheets

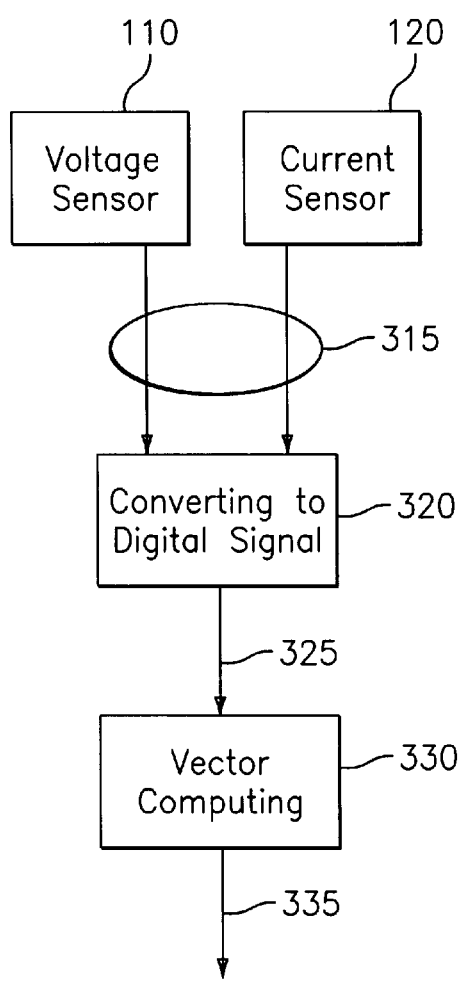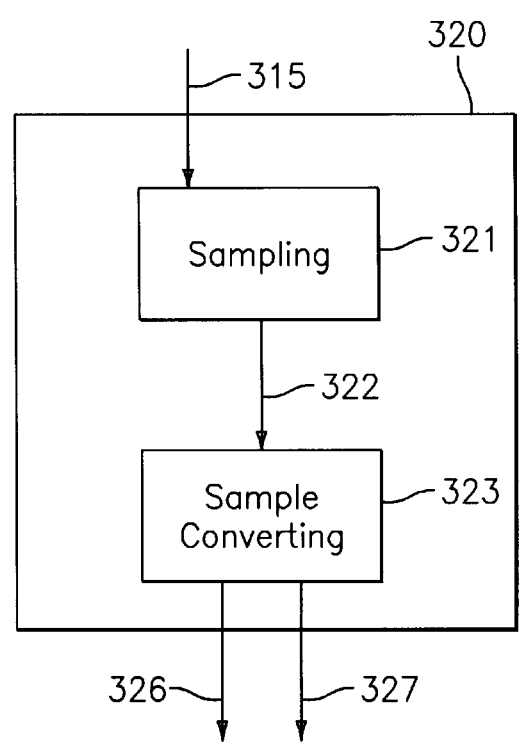
FIG. 3A
FIG. 3AB

| Circuit Topology | Signals Sensed | Processing |
|---|---|---|
| 2-element, 3-wire meter<br>3-phase, 3-wire delta service | $V_a, I_a, V_c, I_c$ | $V_{b0} \leftarrow 1/3(V_a + V_c)$<br>$V_{a0} \leftarrow V_{b0} + V_a$<br>$V_{c0} \leftarrow V_{b0} + V_c$<br>$I_{a0} \leftarrow I_a$<br>$I_{b0} \leftarrow -(I_a + I_c)$<br>$I_{c0} \leftarrow I_c$ |
| 1-element, 3-wire meter<br>1-phase, 3-wire service | $V_a, I_a, I_c$ | $V_{a0} \leftarrow V_a/2$<br>$V_{b0} \leftarrow 0$<br>$V_{c0} \leftarrow V_{a0}$<br>$I_{a0} \leftarrow I_a$<br>$I_{b0} \leftarrow 0$<br>$I_{c0} \leftarrow I_c$ |
| 2-1/2-element, 4-wire meter<br>3-phase, 4-wire wye service | $V_a, I_a, I_b, V_c, I_c$<br>($V_b$ absent) | $V_{a0} \leftarrow V_a$<br>$V_{b0} \leftarrow -(V_a + V_c)$<br>$V_{c0} \leftarrow V_c$<br>$I_{a0} \leftarrow I_a$<br>$I_{b0} \leftarrow I_b$<br>$I_{c0} \leftarrow I_c$ |
| 2-element, 3-wire meter<br>3-phase, 4-wire delta service<br>1-phase, 3-wire service<br>3-phase, 4-wire wye service | $V_a, I_a, V_b, V_c, I_c$ | $V_{a0} \leftarrow V_a - V_b$<br>$V_{b0} \leftarrow 0$<br>$V_{c0} \leftarrow V_c$<br>$I_{a0} \leftarrow I_a$<br>$I_{b0} \leftarrow 0$<br>$I_{c0} \leftarrow I_c$ |
| 2-element, 3-wire meter<br>1-phase, 3-wire service<br>network servicce | $V_a, I_a, V_c, I_c$ | $V_{a0} \leftarrow V_a$<br>$V_{b0} \leftarrow 0$<br>$V_{c0} \leftarrow V_c$<br>$I_{a0} \leftarrow I_a$<br>$I_{b0} \leftarrow 0$<br>$I_{c0} \leftarrow I_c$ |
| 1-element, 2-wire meter<br>1-phase, 2-wire service | $V_a, I_a$ | $V_{a0} \leftarrow V_a$<br>$V_{b0} \leftarrow 0$<br>$V_{c0} \leftarrow 0$<br>$I_{a0} \leftarrow I_a$<br>$I_{b0} \leftarrow 0$<br>$I_{c0} \leftarrow 0$ |

*FIG. 9*

VACUUM FIXTURE

This is a divisional of co-pending application Ser. No. 08/564,543 filed on Nov. 30, 1995.

FIELD OF THE INVENTION

The present invention relates to electrical power line measurement, and more particularly to apparatus and methods for metering vector electrical quantities for electrical power lines having multiple conducting paths.

BACKGROUND OF THE INVENTION

In the distribution of electrical energy, electric utility companies have typically found it desirable to measure quantities related to the delivery of electrical energy to a consumer which accurately reflect the cost of delivering that energy to that consumer, and thus equitably apportion the cost of delivering energy among all the users of the power system. Early on, utilities realized that billing customers based merely upon measurement of actual energy delivered—Watt-hours—fails to accurately reflect the cost of delivering energy to the customer. For example, large industrial users may have inductive loads, such as large induction motors, which induce significant phase shifts between voltages and currents in the power line, thus requiring advancement of generator angles and capacitive compensation by the utility in order to maintain voltage levels, efficiently deliver energy to consumers and preserve stability in the power system. This added generation and capital equipment cost is not reflected in measurements of energy delivered at the customer metering point.

Accordingly, other measures of electric power have been developed. For example, utilities typically bill not only for real load energy as watthours delivered to a user, but also reactive load quadergy as varhours (or reactive volt-ampere hours), and power factor (cos θ). By measuring both watthours and varhours eletric utilities can more a accurately apportion the costs of supplying energy to those customers with inductive loads which demand the most from the power delivery network.

Potential errors in power measurement attributable to nonsinusoidal conditions were also recognized early in this century. Nearly sixty years ago, power systems engineers attempted to develop a general unified theoretical model for power systems which accounts for harmonics and distortion. This model is described in an article, "*Definitions of Power and Related Quantities*" by Harvey L. Curtis and Francis B. Silsbee of the National Bureau of Standards, published for the 1935 AIEE Summer Conference. The definitions in the Curtis and Silsbee article are derived from a three-dimensional vector model of electrical power applicable for all harmonics and phases. These definitions have survived largely intact through the publication of the latest editions of the "*IEEE Std 100, Standard Dictionary of Electrical and Electronic Terms.*"

Power vector relationships for a power line are illustrated in FIG. 19. The *ANSI/IEEE STD* 100 *Dictionary of Electrical and Electronic Terms* defines "phasor power" S as the magnitude of a two-dimensional power vector whose rectangular components are "active power" P and "reactive power" Q. In systems of more than one conducting path, i.e., "polyphase" systems and "single-phase" systems with more than one conducting path, phasor power S is the vector sum of active power P and reactive power S for the system, for all harmonics. As will be understood by those skilled in the art, phasor power S is equal to active power P when all load elements are resistive. In one form or another, it is phasor power, or more specifically phasor volt-ampere-hours, which utilities have traditionally metered and billed. Typically, utilities have measured phasor volt-ampere-hours for the fundamental frequency of the system voltage using conventional watthour meters and varhour meters.

"Apparent power" U is defined as the magnitude of a three-dimensional vector power with orthogonal components of active power P, reactive power Q and a third component, "distortion power" D. Apparent power and apparent volt-ampere-hours provide a more comprehensive measure of the characteristics of a power line. For an isolated two-terminal circuit, apparent power U may be treated as a scalar, the product of the root-mean-square voltage and current in the single conducting path. In a system having more than one conducting wire, however, vector apparent power and vector apparent volt-ampere-hours are vectors, the vector sum of real, reactive and distortion power components for all phases and harmonics. For this reason, vector apparent power and vector apparent volt-ampere-hours have been largely ignored as practical metering quantities because of a lack of techniques to accurately measure their vector components. Instead, utilities have relied on alternative measurements such as quadergy and phasor volt-ampere-hours, for which measurement techniques and equipment could be easily developed.

Conventional sampling electronic watthour meters generally accurately measure energy by accumulating instantaneous power measurements. This is typically achieved by sampling voltage and current on the power line and converting the sampled voltages and currents into digital values which may be multiplied to compute the instantaneous power. These sampling products are accumulated to yield a measurement of energy transferred by the power line, which can be inherently accurate for all significant harmonics, assuming the sampling rate satisfies the sampling theorem. As defined in *ANSI/IEEE STD* 100-1992, apparent power for a two terminal circuit is:

$$U_x = E_{rms} \times I_{rms}$$

where $E_{rms}$ and $I_{rms}$ are the root-mean-square values of the voltage and current for the circuit. Thus, viewing voltage and currents on a power line as a composite of sinusoidal signals, apparent power (or apparent volt-ampere-hours) for all harmonics on a phase of a power line may be determined by measuring RMS voltage and current.

Measurement of quadergy, however, is more problematic. The measurement of varhours conventionally has been accomplished either by using a second meter in conjunction with a conventional watthour meter or, more recently, a meter with the built-in capability of measuring both watthours and varhours. Typically, the technique for measuring varhours involves phase-shifting the measured line voltage by 90° using phase-shifting transformers (in analog meters) or time delay elements (in digital meters). Both of these methods may entail significant errors arising from disregarding or failing to accurately shift all the significant harmonics of the voltage.

Metering based on arithmetic apparent volt-ampere-hours for the power line has been proposed as an approximation of vector apparent volt-ampere-hours. Arithmetic apparent power for a multi-phase system represents the arithmetic sum of the magnitude of the apparent power for each of the individual phases. Although relatively easy to compute, arithmetic apparent power tends to closely approximate vector apparent power only in cases where the phases of the power line are balanced and symmetric. Even in those cases, its measurement often leads to unexpected results under certain circumstances where the current or voltage waveforms are nonsinusoidal. These characteristics tend to make arithmetic apparent power an unsuitable quantity for electrical metering.

Conventional electricity meters and metering methods may fail to provide accurate measurement of the actual cost of providing electrical energy to consumers where distortion is present. Increasing use of solid state switched motor drives, large switching power supplies and switched loads such as computers lead to distorted current waveforms, generally accompanied by a greater amount of associated distortion power. Distortion power increases demand on utility equipment and increases energy losses. Measures such as phasor volt-ampere-hours and arithmetic apparent volt-ampere-hours fail to rationally reflect these associated costs.

Errors arising from use of these conventional measurement techniques will become increasingly significant as the cost of delivering energy increases. Utilities, driven by costs and the demands of their customers for billing equity, have an increasing need for accurate metering which reflects the true cost of delivering energy. In order to provide continuity and minimize replacement costs, however, new equipment and methods should be compatible with conventional meter connections and conventional metering formats, as well as with the various circuit topologies employed in electrical services.

SUMMARY OF THE INVENTION

In the light of the foregoing, it is therefore an object of the present invention to provide electricity meters and metering methods for metering of electricity on a power line having at least two conductive paths.

It is another object of the present invention to provide electricity meters and metering methods for metering of electricity which are accurate for significant harmonics of the fundamental frequency of the power line.

It is another object of the present invention to provide electricity meters and metering methods for metering of electricity which are compatible with conventional meter connections and capable of utilizing conventional metering formats.

It is another object of the present invention to provide electricity meters and metering methods for metering of electricity which are adaptable to various power line circuit topologies.

These objects and advantages are provided by electricity meters and metering methods for vector metering of electricity which sense line voltage and line current signals on the power line, convert the sensed signals into a digital signal, and compute vector metering quantities for the power line over a determined interval of orthogonality for the sensed line voltages and line currents. Accordingly, accurate measurements of the vector metering quantity may be achieved. The computed vector metering quantity may include vector apparent volt-ampere-hours, vector apparent power, arithmetic apparent volt-ampere-hours, arithmetic apparent power, phasor volt-ampere-hours, distortion volt-ampere-hours, distortion power, quadergy, reactive power, energy, active power, power factor and distortion power factor. Vector computing means for computing vector metering quantities is preferably implemented using a digital signal processor working in combination with a general-purpose microprocessor, integrated within an electricity meter.

The present invention provides accurate and equitable measurement of electricity through accurate vector metering of electrical power. The present invention also provides flexible, programmable metering which allows billing of the metered customer based on combinations of metered vector electrical quantities. The present invention also is easily adaptable to different electrical service environments, such as 4-wire wye, 3-wire single phase, 3-wire delta and the like, without requiring component changes or elaborate hardware modifications. Meter installation and power line maintenance are also aided.

In particular, vector metering of electricity is achieved in an electricity meter according to the present invention by sensing line voltage and line current signals on a power line. An interval of orthogonality for the sensed voltage and current signals is determined from the sensed voltage signals. The sensed voltage and current signals are converted into a digital signal from which a vector metering parameter is computed for the interval of orthogonality using vector computing means. Preferably, the sensed voltage and current signals are converted into corresponding sequences of line voltage and line current samples, corresponding to a consecutive plurality of sampling times spaced a sampling interval apart. Preferably, the sampling interval is uniform.

A digital phase-to-neutral voltage signal and corresponding phase current signal may be computed from the digital signal prior to computing the vector metering quantity, thus defining a phase of the power line with respect to a real or imputed neutral for the power line. Preferably, the digital phase-to-neutral voltage signal includes a series of digital phase-to-neutral voltage samples, and the digital phase current signal includes a series of digital phase current samples, each sample corresponding to the sampling time for the corresponding digital line voltage sample or line current sample.

The interval of orthogonality is preferably determined by detecting the passage of a predetermined integral number of cycles of a fundamental frequency reference signal which approximates the frequency of a fundamental component of the voltages and currents on the power line. Preferably, an interval of orthogonality represents 60 cycles of the fundamental frequency reference signal for a nominal 60 Hz power system, or 50 cycles of the fundamental frequency reference signal for a nominal 50 Hz system. The interval of orthogonality is preferably determined by narrow-band filtering the computed phase-to-neutral voltage signals to produce corresponding fundamental frequency phase-to-neutral voltage signals. These fundamental frequency signals may be linearly combined to produce the fundamental frequency reference signal.

According to one aspect of the present invention, computing a vector metering quantity for the interval of orthogonality includes computing vector apparent volt-ampere-hours. Energy, quadergy and apparent volt-ampere-hours are computed for each phase of the power line for the interval of orthogonality. Vector-apparent volt-ampere-hours for the interval of orthogonality are computed from the computed energy, quadergy and apparent volt-ampere-hours. Distortion volt-ampere-hours for each phase of the power line may be computed from these quantities. As will be understood by those skilled in the art, by computing energy, quadergy and distortion volt-ampere-hours over an interval of orthogonality, the computed energy, quadergy and distortion volt-ampere-hour accurately represent vector components of the power line. Vector algebra may be performed upon these components to yield an accurate measurement of the vector apparent volt-ampere-hours for the power line during the interval.

Quadergy is preferably computed by applying a reactive power filter to the digital phase-to-neutral voltage signal and the digital phase current signal. Preferably, this filter includes digital filters implemented in the vector computing means. The reactive power filter preferably includes multiple phase-shifting filters and multipliers which produce two phase-shifted intermediate power product signals which are summed to produce an output signal closely approximating the quadergy for the power line for all harmonics within a predetermined frequency range.

According to another aspect of the present invention, active, reactive, distortion and vector apparent power are computed for the power line from the computed energy, quadergy, distortion volt-ampere-hours and vector apparent volt-ampere-hours. Preferably, these vector quantities are computed by dividing the computed energy, quadergy, distortion or vector apparent volt-ampere-hours for the interval of orthogonality by the number of sampling times occurring within the interval to yield the corresponding power quantity. A power factor and a distortion power factor may also be computed from the computed energy, quadergy and apparent-volt-amperes per phase during the interval.

In another aspect of the present invention, a neutral current magnitude for the power line is computed from the computed digital phase current signals. A neutral current status may be computed by comparing the computed neutral current magnitude to a predetermined threshold, indicating a unacceptable phase imbalance or other maintenance condition. Similarly, an effective line voltage may be computed. A line voltage status may be computed by comparing the computed effective line voltage to an expected nominal operating voltage.

A phase angle associated with a fundamental frequency component of a sensed line voltage signal may also be computed using a migratory decimation technique. Samples of a narrow-band filtered version of a digital line voltage signal are selected over a series of consecutive periods of the fundamental frequency reference signal to obtain a set of migratory decimated samples. These samples preferably are selected such that a first selected migratory decimated sample coincides with a first zero-crossing of the fundamental frequency reference signal. The next selected migratory decimated sample is selected from the next period of the fundamental frequency reference signal, delayed a predetermined migratory decimation interval from the point on the fundamental frequency reference signal waveform at which the preceding sample was taken. Samples are similarly taken from succeeding intervals, thus yielding a set of migratory decimated samples approximating a period of the digital voltage signal. Fourier analysis is applied to these migratory decimated samples to compute the phase angle of the fundamental frequency component of the line voltage signal with respect to the reference signal. Thus an accurate measurement of line voltage phase angle is provided, useful for meter installation and maintenance, among other tasks.

In another aspect of the present invention, metering quantities for an interval of orthogonality may be cumulatively recorded, analyzed for minimum and maximum values over a period of interest, and subjected to other analyses for billing and other purposes. An identified metering quantity may be computed, based on an associated detent. Vector metering quantities may also be computed notwithstanding the loss of a sensed line voltage signal, thus providing a means for estimating power when a voltage transformer or other component has failed.

Accordingly, vector electricity meters and methods for vector metering of electricity are provided which can accurately measure vector metering quantities. These meters and methods provide for metering of electricity which accurately and equitably reflects the costs of delivering energy to customers. These meters and methods are also adaptable to various power line circuit topologies, and are compatible with conventional meter connections and formats.

BRIEF DESCRIPTION 0F THE DRAWINGS

FIG. 3A is a block diagram illustrating operations in a vector electricity meter according to the present invention.

FIG. 3B is a block diagram illustrating conversion of sensed line voltage and current signals to digital samples according to the present invention.

FIG. 9 is a table illustrating exemplary operations for computing phase-to-neutral voltage samples and phase current samples based on an indicated circuit topology according to the present invention.

Figure 12A:
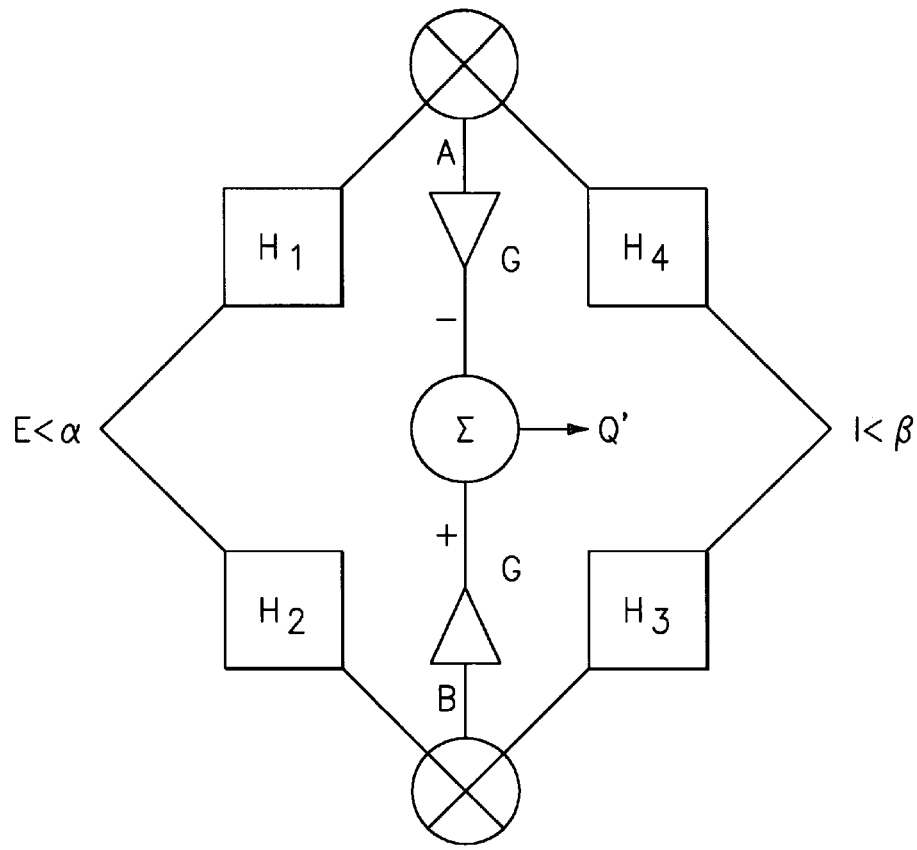
FIG. 12A is a block diagram illustrating a reactive power filter according to the present invention.
Figure 12B:
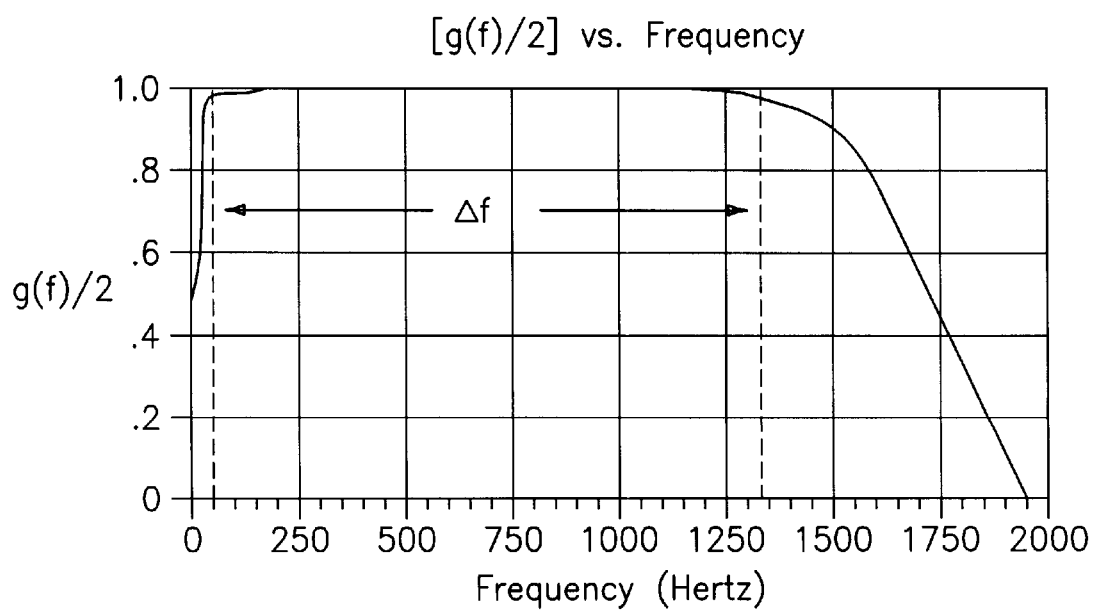

FIG. 12B graphically illustrates a transfer function for a reactive power filter according to the present invention.

Figure 13:
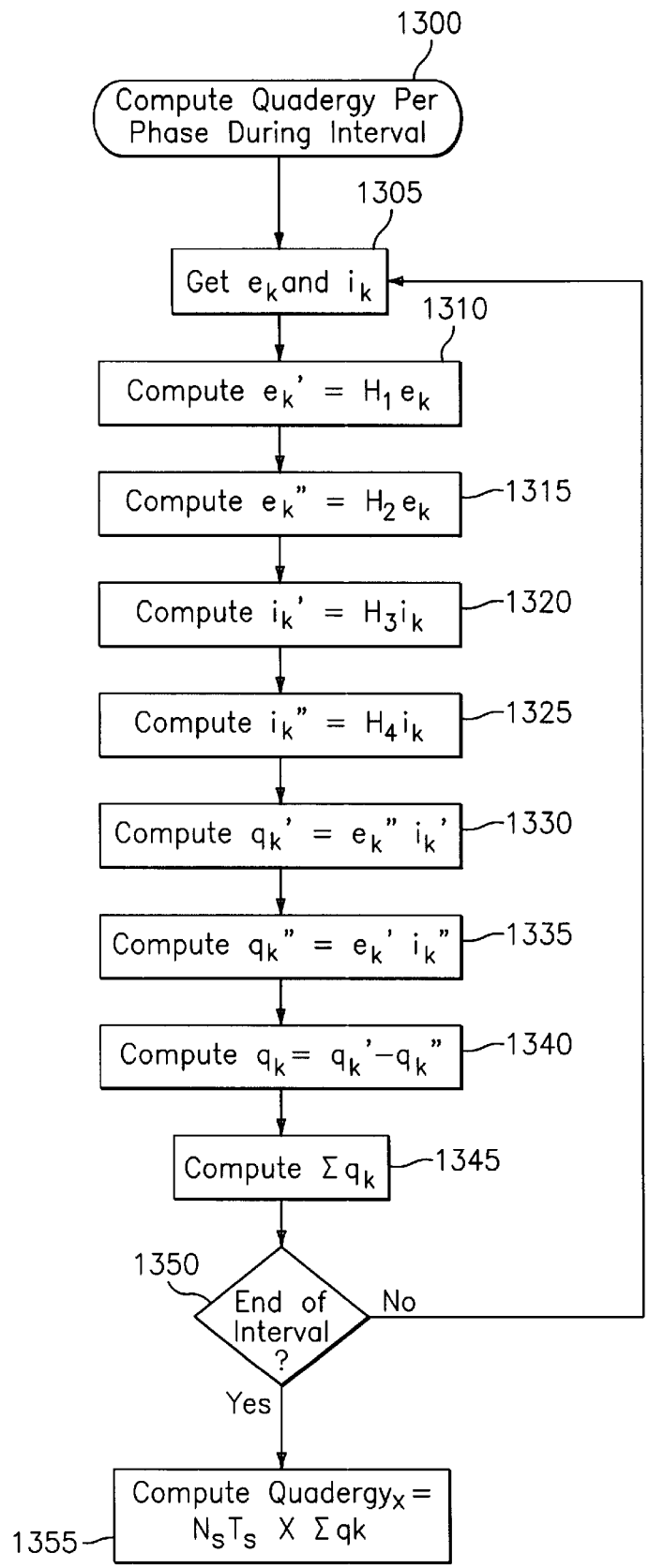

FIG. 13 is a block diagram illustrating operations for computing quadergy per phase for an interval of orthogonality according to the present invention.

Figure 14:
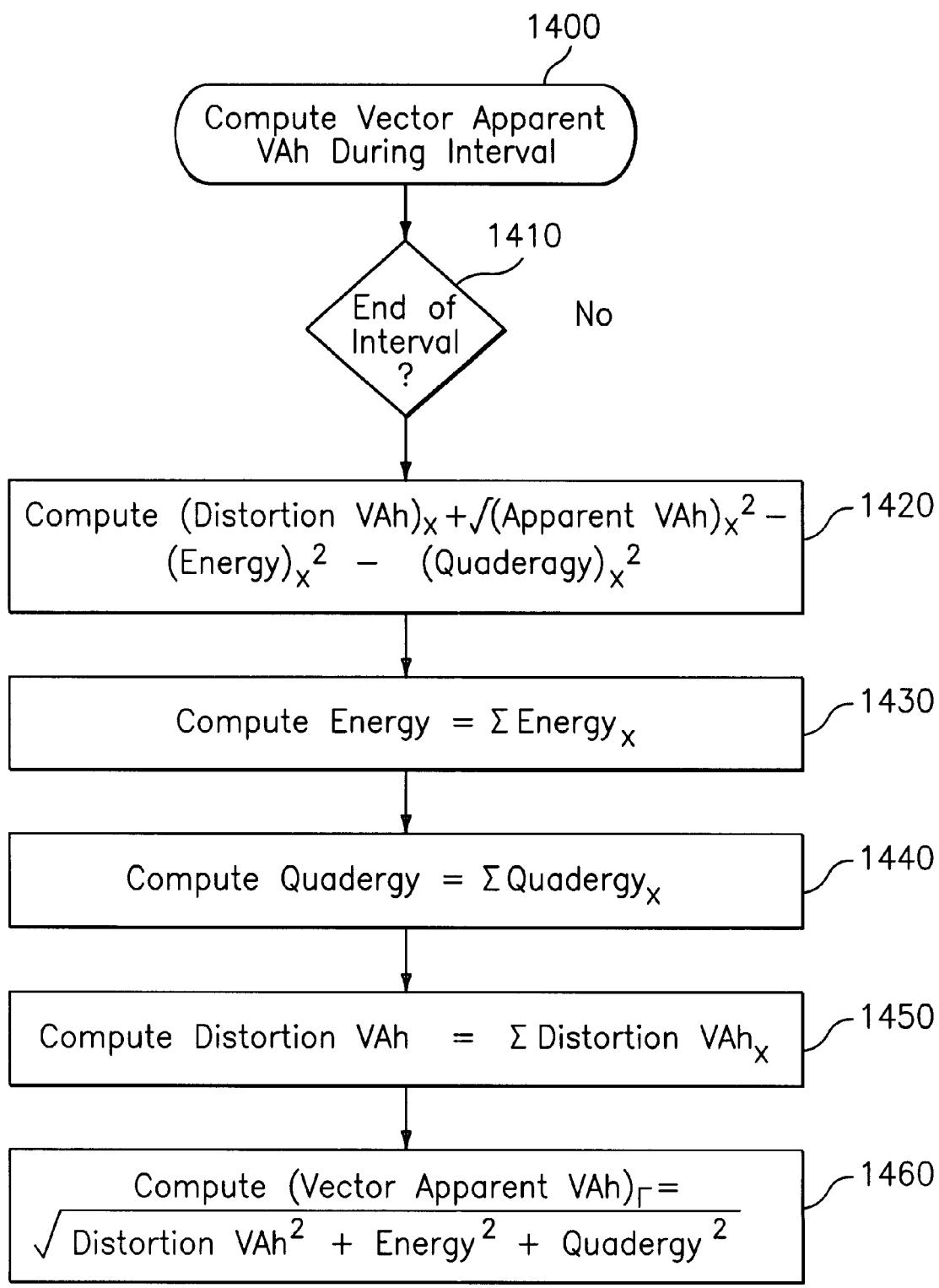

FIG. 14 is a block diagram illustrating operations for computing vector apparent volt-ampere-hours for a power line for an interval of orthogonality according to the present invention.

Figure 15A:
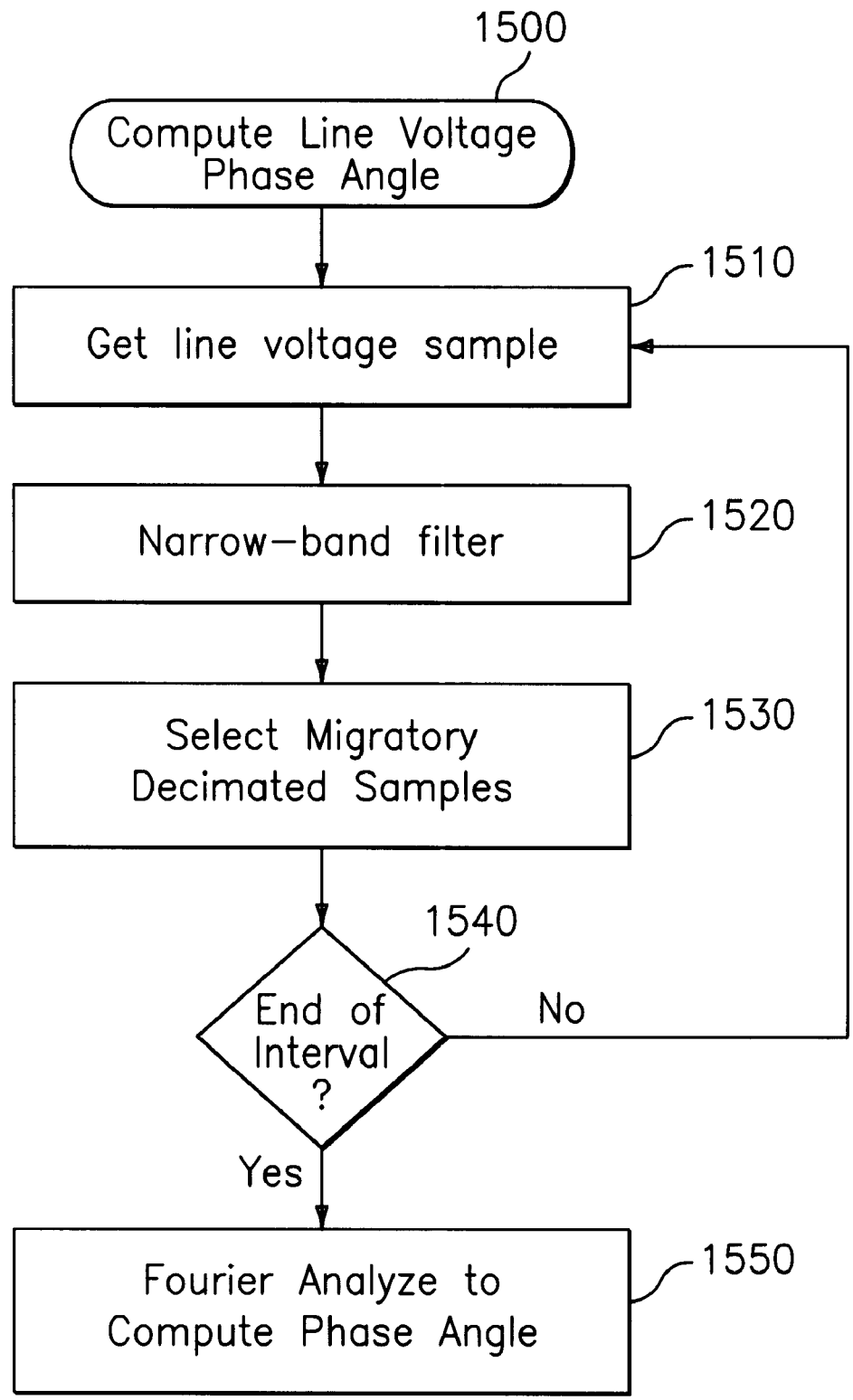

FIG. 15A is a block diagram illustrating operations for computing a line voltage phase angle according to the present invention.

Figure 15B:
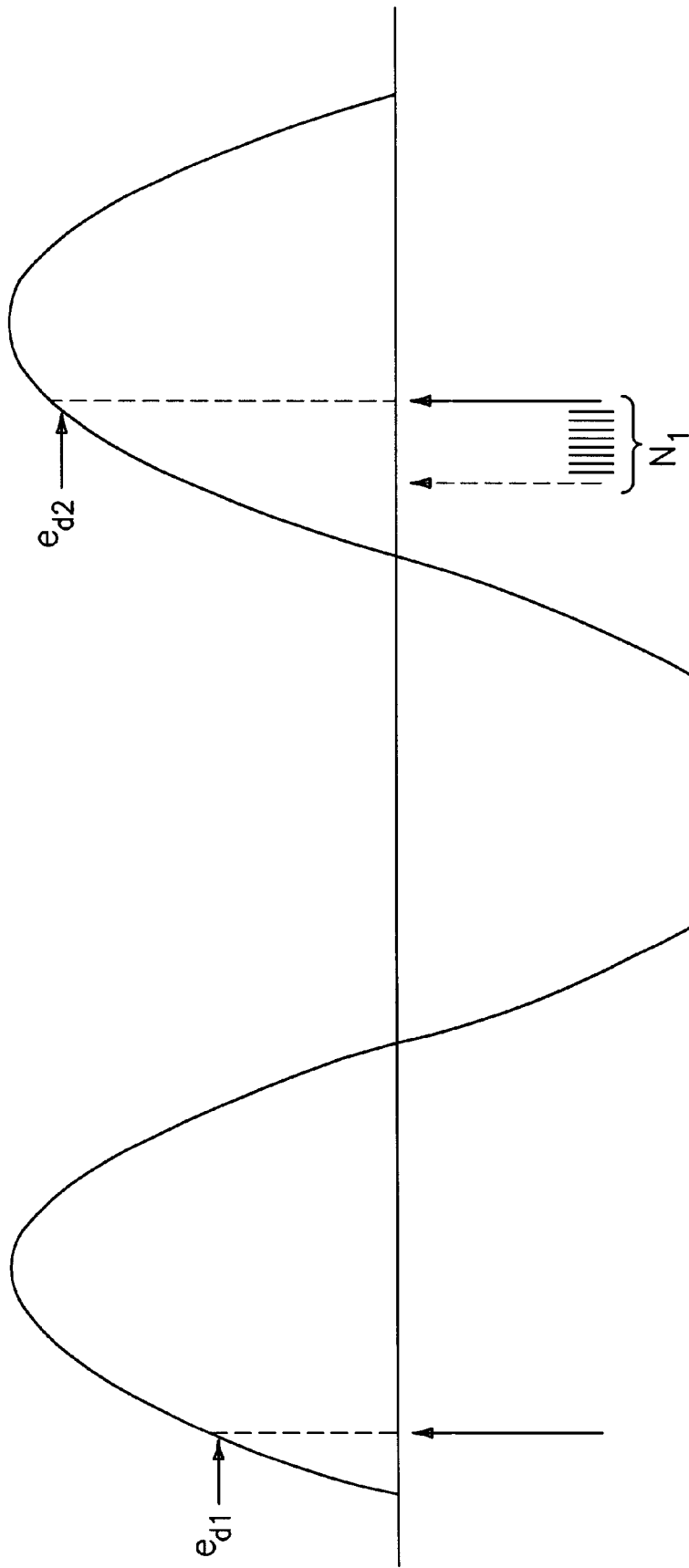

FIG. 15B is a block diagram illustrating decimated sampling for phase angle computation according to the present invention.

Figure 16A:
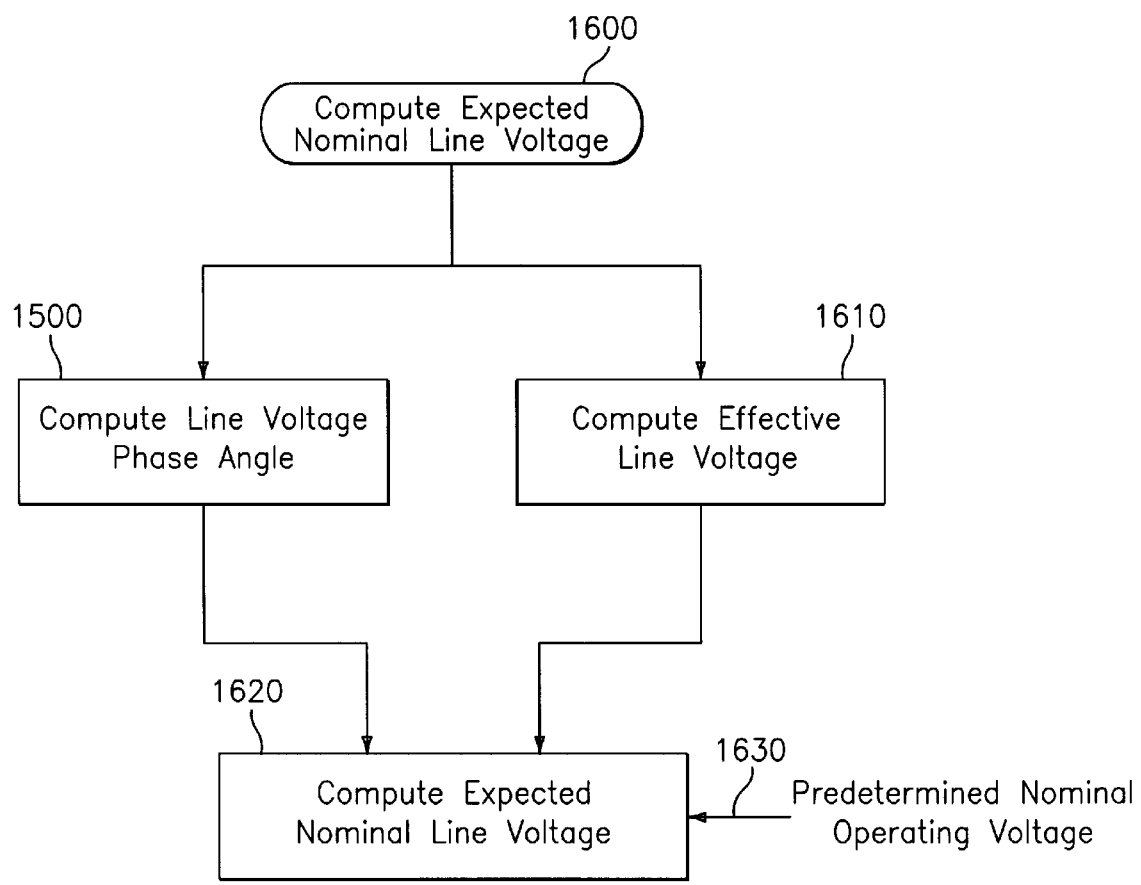

FIG. 16A is a block diagram illustrating operations for computing an expected nominal line voltage according to the present invention.

Figure 16B:
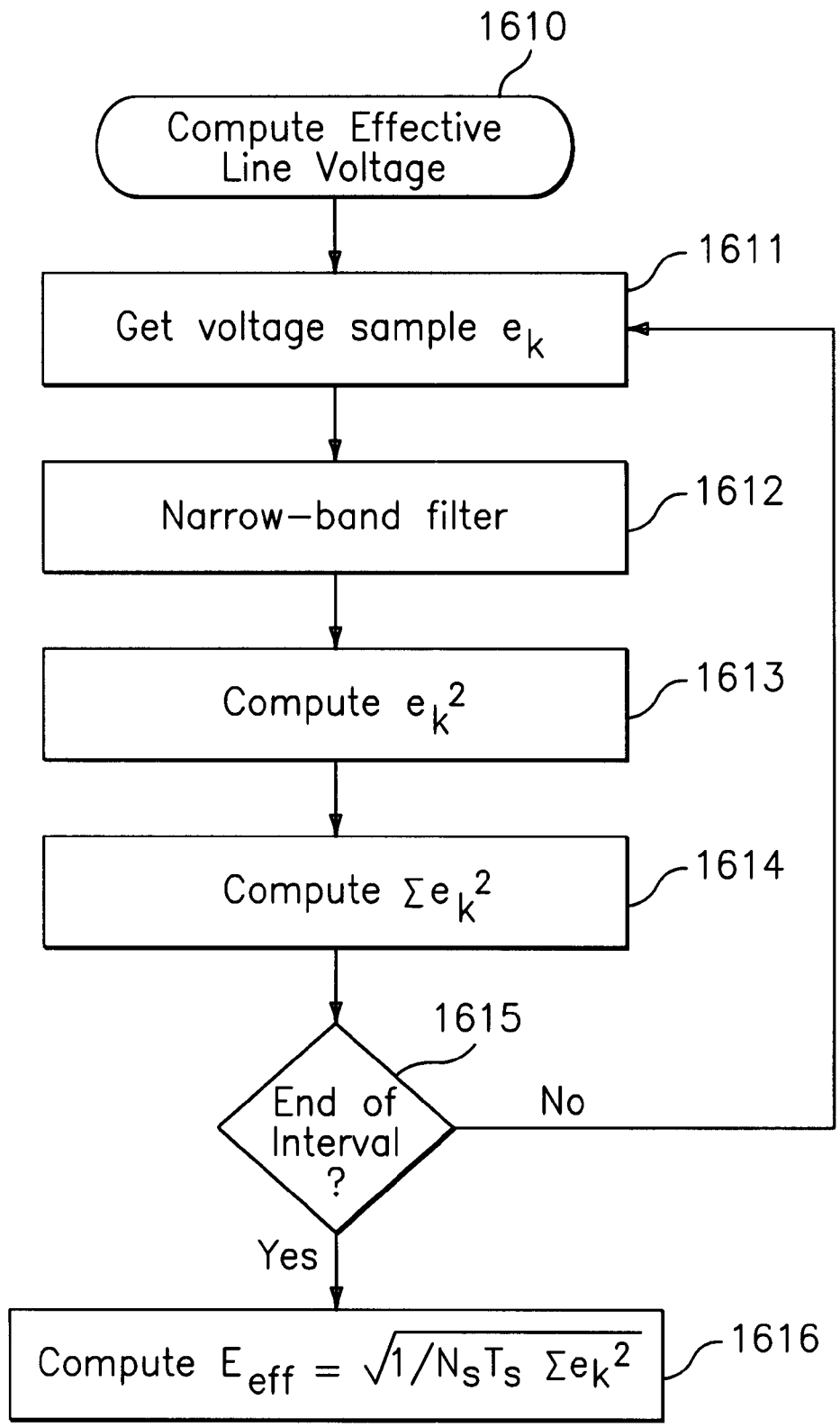

FIG. 16B is a block diagram illustrating operations for computing an effective line voltage according to the present invention.

Figure 17:
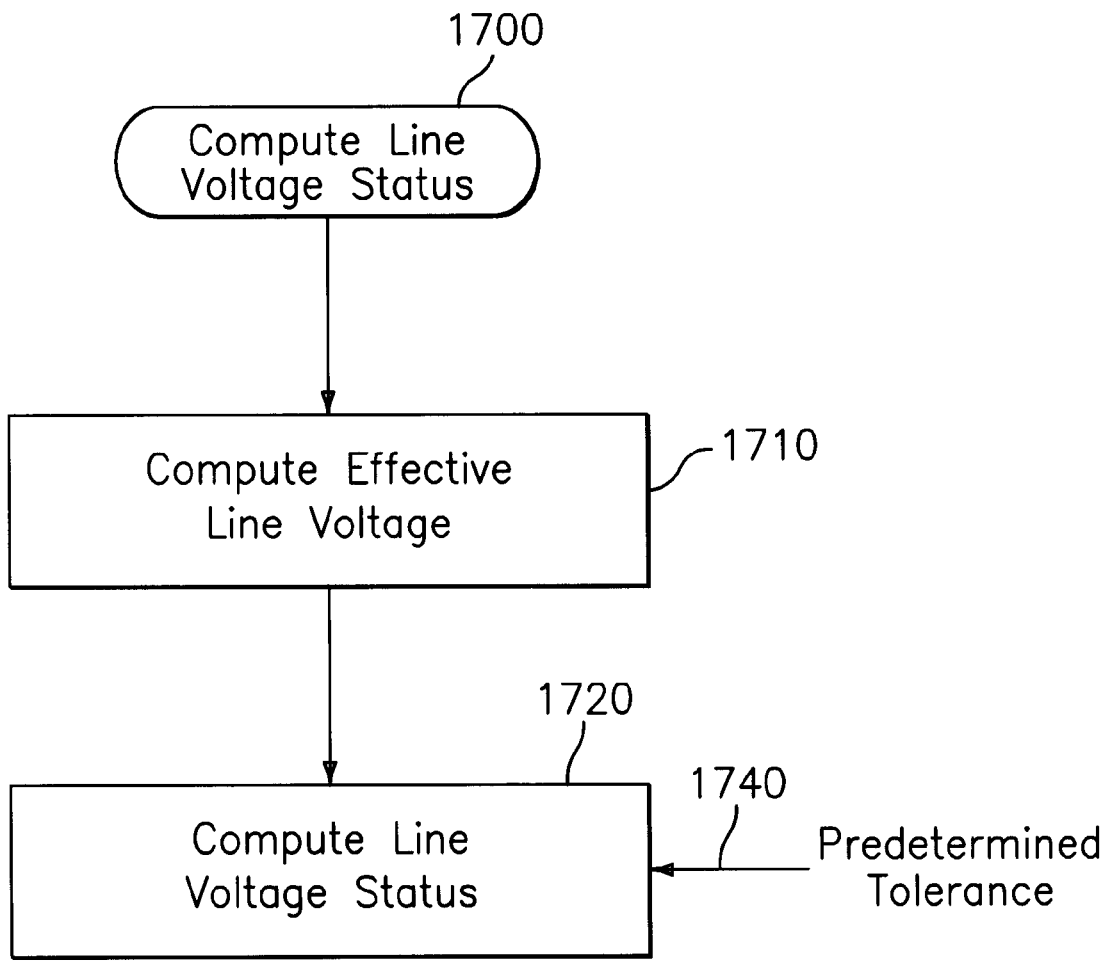

FIG. 17 is a block diagram illustrating operations for computing a line voltage status according to the present invention.

Figure 18:
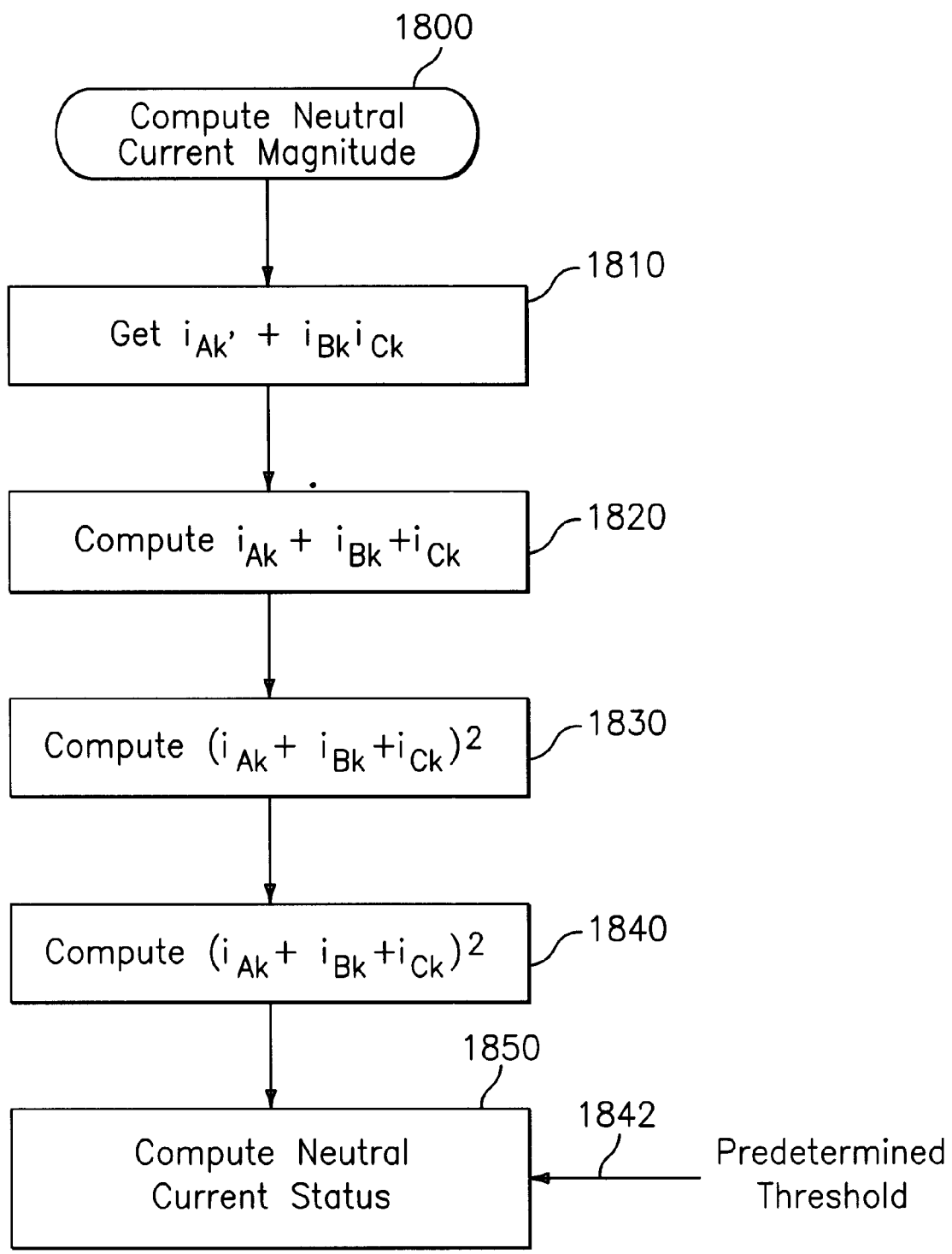

FIG. 18 is a block diagram illustrating operations for computing a neutral current magnitude and neutral current status according to the present invention.

Figure 19:
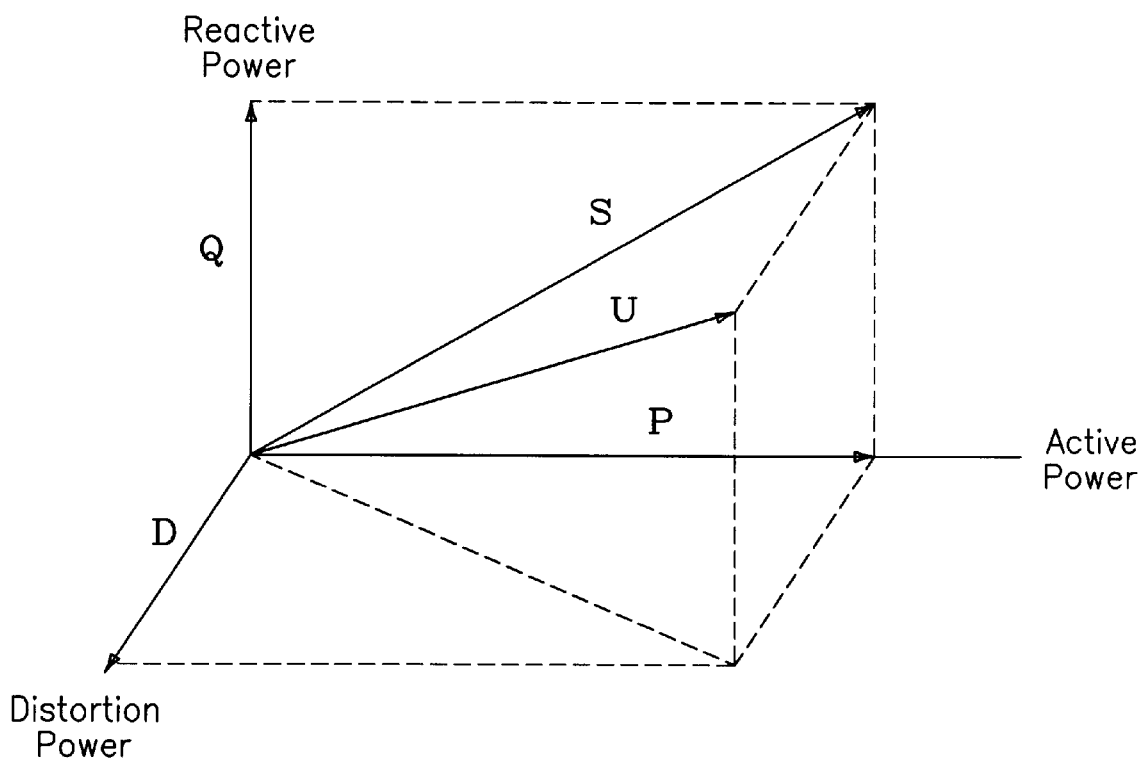

FIG. 19 graphically illustrates power vector relationships.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

FIGS. 6–7, 10–11, 13–15A and 16A–18 are flowchart illustrations of methods and systems according to the invention. It will be understood that each block of the flowchart illustrations, and combinations of blocks in the flowchart illustrations, can be implemented by computer program instructions. These computer program instructions may be loaded onto a computer or other programmable apparatus to produce a machine, such that the instructions which execute on the computer or other programmable apparatus create means for implementing the functions specified in the flowchart block or blocks. These computer program instructions may also be stored in a computer-readable memory that can direct a computer or other programmable apparatus to function in a particular manner, such that the instructions stored in the computer-readable memory produce an article of manufacture including instruction means which implement the function specified in the flowchart block or blocks. The computer program instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing the functions specified in the flowchart block or blocks.

Accordingly, blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware-based computer systems which perform the specified functions or steps, or combinations of special purpose hardware and computer instructions.

A Vector Electricity Meter

Figure 1:
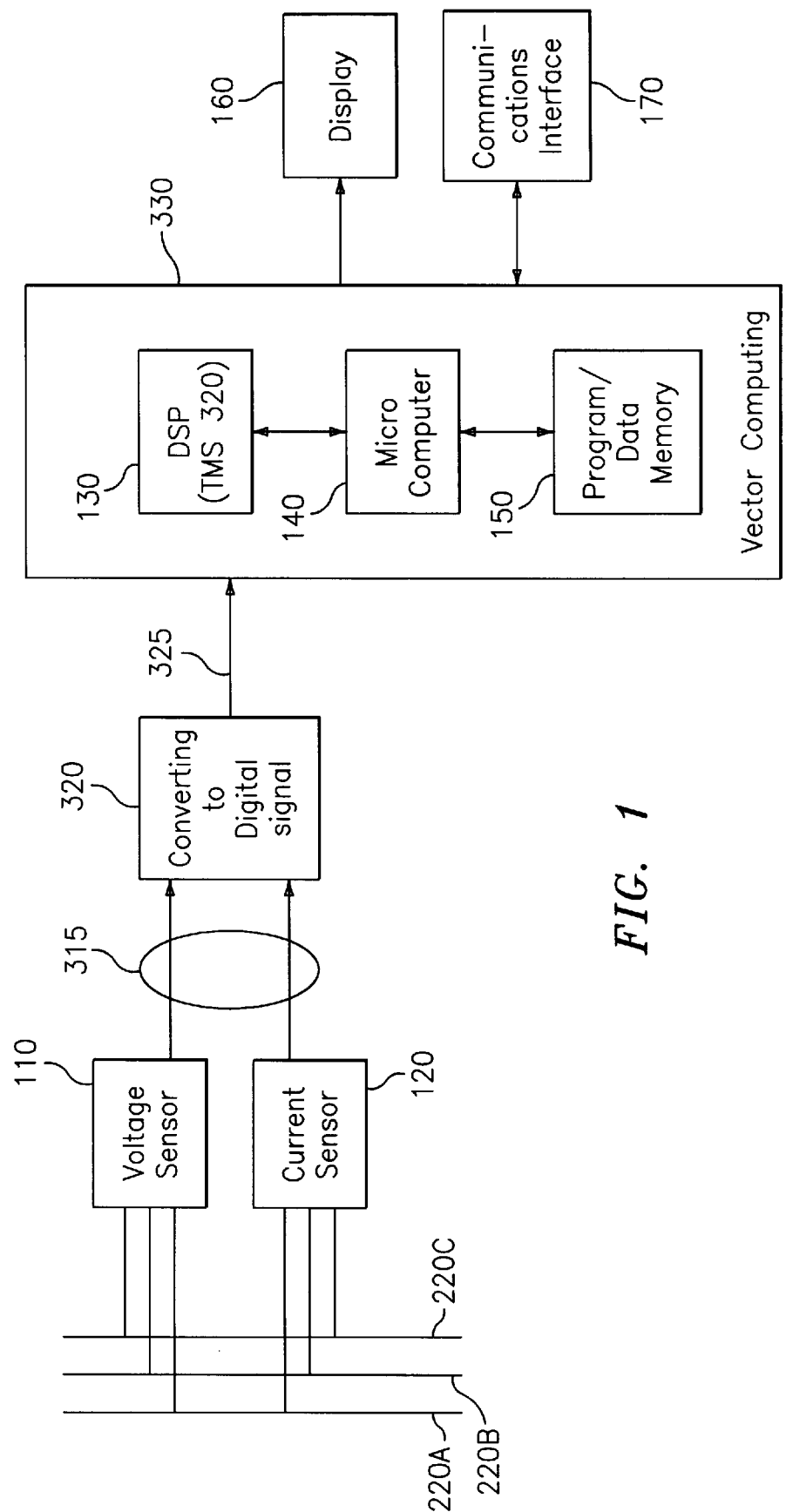
FIG. 1 is a schematic diagram illustrating a vector electricity meter according to the present invention.
Figure 2:
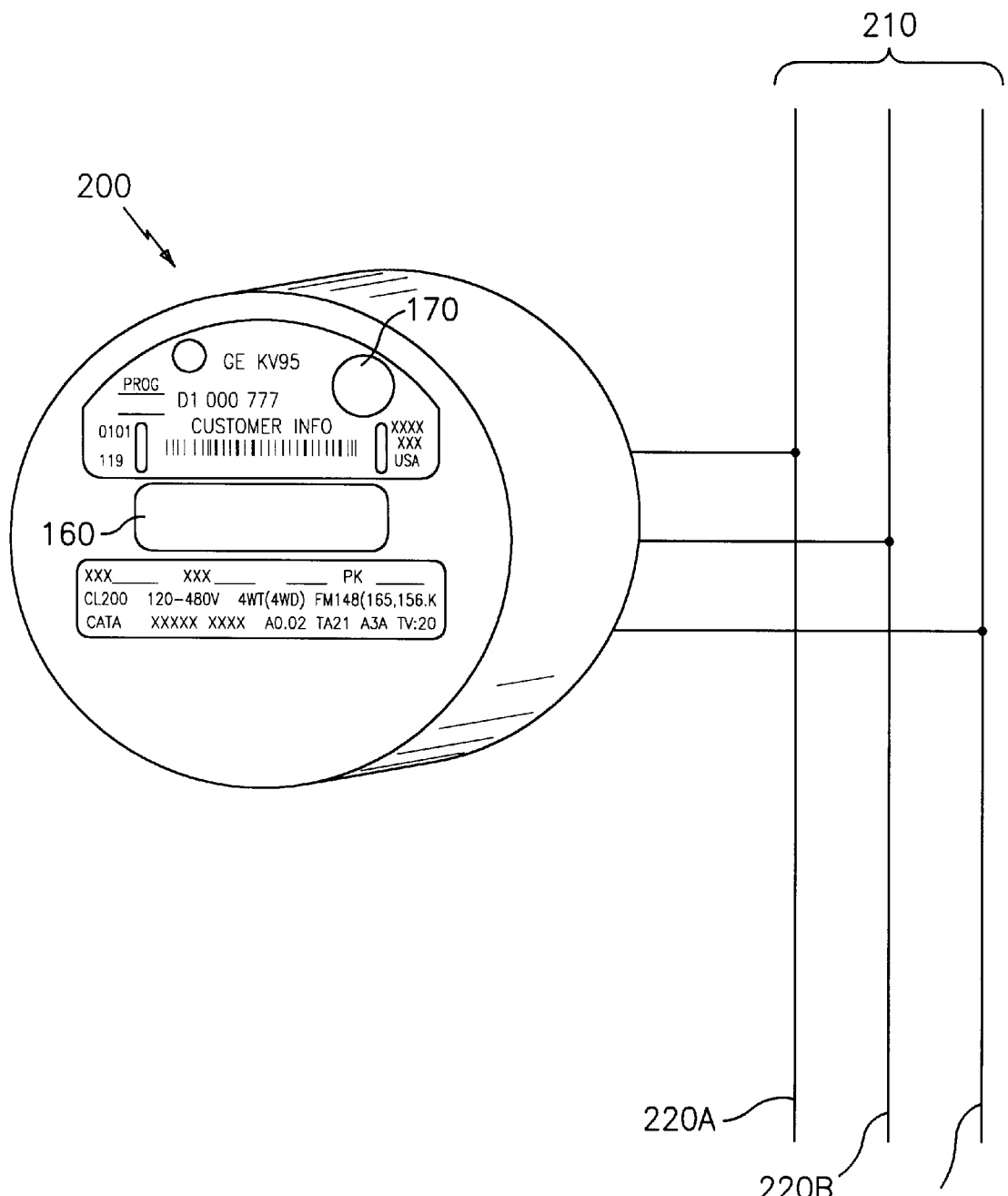
FIG. 2 is a schematic block diagram illustrating a vector electricity meter housed within a meter case according to the present invention.

FIG. 1 and 2 illustrate a vector electricity meter according to the present invention. Voltage sensor 110 and current sensor 120 sense voltage and current signals on a power line and input the sensed voltages and currents 315 into converting means 320. Converting means 320, such as an analog-to-digital converter (A/D), may include signal processing circuits for rejecting DC components in the sensed voltages and currents 315, compensating for phase shifts induced by sensing means, and the like, as well as means for sampling the sensed voltages and currents to obtain a digital signal 325.

The digital signal 325 is input into vector computing means 330, shown in FIG. 1 as including a computer program running on a digital signal processor 130, a microcomputer 140 and a program/data memory 150. Preferably, digital signal processor (DSP) 130 performs vector power computations based on the digital signal 325, under the control of the microcomputer 140. Digital signal processor 130 preferably is a high-speed processing device having a highly parallel architecture which quickly performs repetitive calculations. Examples of digital signal processor 130 are devices in Texas Instruments Corporation's TMS320x line of digital signal processors. In addition to controlling digital signal processor 130, the microcomputer 140 may control other peripheral devices, such as a display 160 or a communications interface 170. Those skilled in the art will understand that computing means 330 may be implemented using various combinations of hardware and software elements, including other digital signal processing devices or general purpose processors.

Sensing means 310, converting means 320 and vector computing means 330 preferably are integrated within a standard-type electricity meter 200, as shown in FIG. 2. Meter 200 may include an LCD display 160 and an optical port 170 for communicating metering data to a data recorder or other device. Meter 200 may be directly connected to conductors 220A–C of a power line 210 directly for low-voltage, low-power installations, or may be buffered through the use of voltage and current transformers, as is well-known to those skilled in the art.

Vector Electricity Metering—Overview

It will be understood by those skilled in the art that vector apparent power (or vector apparent volt-ampere-hours) for a power line having more than one conducting path may be determined by first determining its three orthogonal components: active power (or energy); reactive power (or quadergy); and distortion power (or distortion volt-ampere-hours). In vector terms:

$$\vec{U} = \vec{P} + \vec{Q} + \vec{D}$$

and $$|\vec{U}| = \sqrt{|\vec{P}|^2 + |\vec{Q}|^2 + |\vec{D}|^2}.$$

In a vector electricity meter according to the present invention, these components are computed over an interval of orthogonality for the sinusoidal components of the periodic voltages and currents on the power line.

Those skilled in the art will understand that an n-dimensional vector y can be represented as a sum of basis vectors $x_1, x_2, \ldots, x_n$:

$$y = c_1 x_1 + c_2 x_2 + \ldots + c_n x_n. \tag{1}$$

If the basis vectors are orthogonal, the inner products of the basis vectors are equal to zero:

$$\langle x_i, x_j \rangle, i \neq j.$$

Forming the inner product of a basis vector $x_i$ with both sides of Equation (1) produces:

$$\langle y, x_i \rangle = c_1 \langle x_1, x_i \rangle + c_2 \langle x_2, x_1 \rangle + \ldots + c_n \langle x_n, x_i \rangle = c_i \langle x_i, x_j \rangle,$$

-continued with $$c_i = \frac{\langle y, x_i \rangle}{\langle x_i, x_j \rangle}.$$

Thus, a vector can be conveniently expressed using an orthogonal basis because the coordinates $c_i$ can be easily calculated.

The relationship between orthogonality and inner products applies to functions in general. The inner product of two functions may be defined as an integral over an interval:

$$\langle g_i(t), g_j(t) \rangle = \int_{t_1}^{t_2} g_i(t) g_j^*(t) dt.$$

As with the basis vectors, the inner product of the two functions is zero if the functions are orthogonal:

$$\langle g_i(t), g_j(t) \rangle = 0, i \neq j.$$

The interval $(t_1, t_2)$ is an interval of orthogonality for the functions $g_i(t)$ and $g_j(t)$. A function can be expressed as a sum of orthogonal functions over the interval of orthogonality $(t_1, t_2)$:

$$f(t) = c_1 g_1(t) + c_2 g_2(t) + \ldots + c_n g_n(t).$$

Thus, a function represented as a sum of orthogonal functions over an interval of orthogconality can be determined using "vector algebra."

In order to accurately perform vector algebra using measured values for energy, quadergy and apparent volt-ampere-hours for each phase of a power line, these vector metering components preferably are measured for an interval of orthogonality so that the vector sum of these vector metering components is an accurate representation of vector apparent volt-ampere-hours, i.e., the inner products of voltage and current are zero. For a power line having voltages and currents including a sinusoidal fundamental frequency component and multiple harmonics thereof, an interval of orthogonality for all the sinusoidal voltages and currents is an integral number of cycles of the fundamental frequency component.

Having explained why vector metering components preferably are calculated over an interval of orthogonality, operations for vector metering according to the present invention will now be explained. FIG. 3A is a block diagram illustrating basic operations for vector metering according to the present invention. Line voltage and line current signals are sensed on the power line by voltage sensor 110 and current sensor 120. In converting means 320, the sensed line voltage and line current signals 315 are converted into a digital signal 325. The digital signal 325 is then input into vector computing means 330, where a vector metering quantity is computed from the digital signal 325.

As shown in FIG. 3B, in converting means 320 a digital signal 325 is produced, preferably in the form of series of digital line voltage samples 326 and line current samples 327. The sensed voltages and current signals 315 are sampled in sampling means 321 at predetermined sampling intervals to produce a plurality of line voltage and current samples 322. The voltage and current samples are converted into corresponding series of digital line voltage samples 326 and digital line current samples 327 in sample converting means 323. It will be understood by those skilled in the art that in order to accurately compute vector metering quantities for a power line from a fundamental frequency of 60 Hz up to the twenty-third harmonic of the fundamental, or 1380 Hz, the sampling rate must be greater than 2760 samples per second. Preferably, the digital line voltage samples 326 and the digital line current samples 327 represent samples taken at a sampling rate of 3900 samples per second, or a sampling interval of approximately 26 microseconds.

Figure 7:
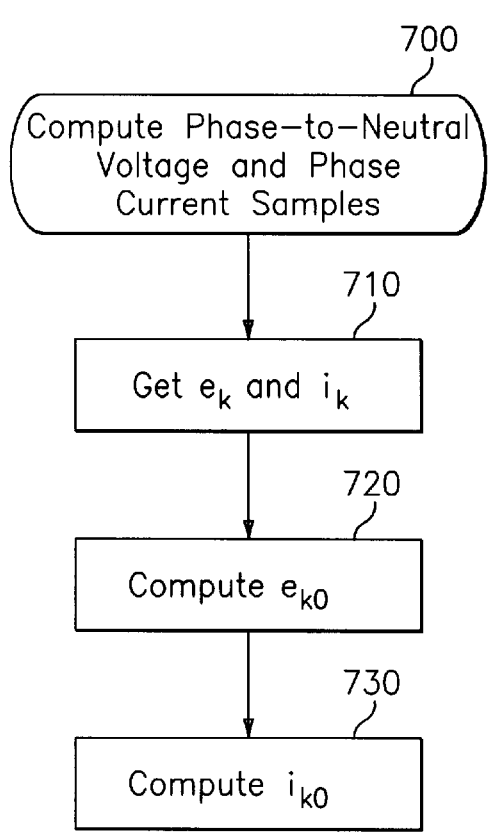
FIG. 7 is a block diagram illustrating operations for computing a phase-to-neutral voltage signal and a phase current signal to define a phase of a power line according to the present invention.

According to the present invention, the vector computing means 330 of FIG. 1 and vector computing operation 330 of FIG. 3A may resolve the sensed line voltages and current signals 315 into equivalent three-phase quantities. As illustrated in FIG. 7, phases preferably are defined for the power line at Block 700 by taking a digital line voltage sample $e_k$ and a corresponding digital line current sample $i_k$ at Block 710, computing a digital phase-to-neutral voltage sample at Block 720, and computing a digital phase current sample at Block 730.

Figure 8:
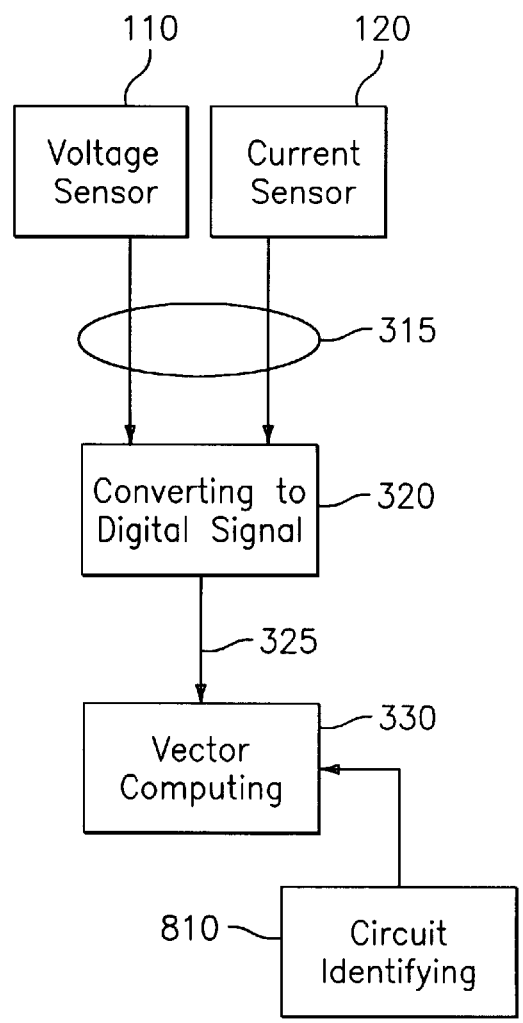
FIG. 8 is a block diagram illustrating computation of a vector metering quantity based on an indicated circuit topology.

The computations of Blocks 720 and 730 are dependent upon the circuit topology of the power line. As illustrated in FIG. 8, circuit identifying means 810 for identifying a circuit topology are provided, with vector computing means 330 performing corresponding calculations of the digital phase-to-neutral voltage signals and the digital phase current signals based on the indicated circuit topology. Those skilled in the art will understand that circuit identifying means 810 may include memory elements, select resistors, DIP switch settings and the like. Exemplary computations for the vector computing means 330 of FIG. 3B for different circuit topologies are illustrated in the table of FIG. 9. For the table, $V_a$, $V_b$ and $V_c$ represent digital line voltage samples 326, $I_a$, $I_b$ and $I_c$ represent corresponding digital line current samples 327, while $V_{a0}$, $V_{b0}$ and $V_{c0}$ represent the corresponding computed digital phase-to-neutral voltage samples and $I_{a0}$, $I_{b0}$ and $I_{c0}$ represent the corresponding computed digital phase current samples.

Figure 4:
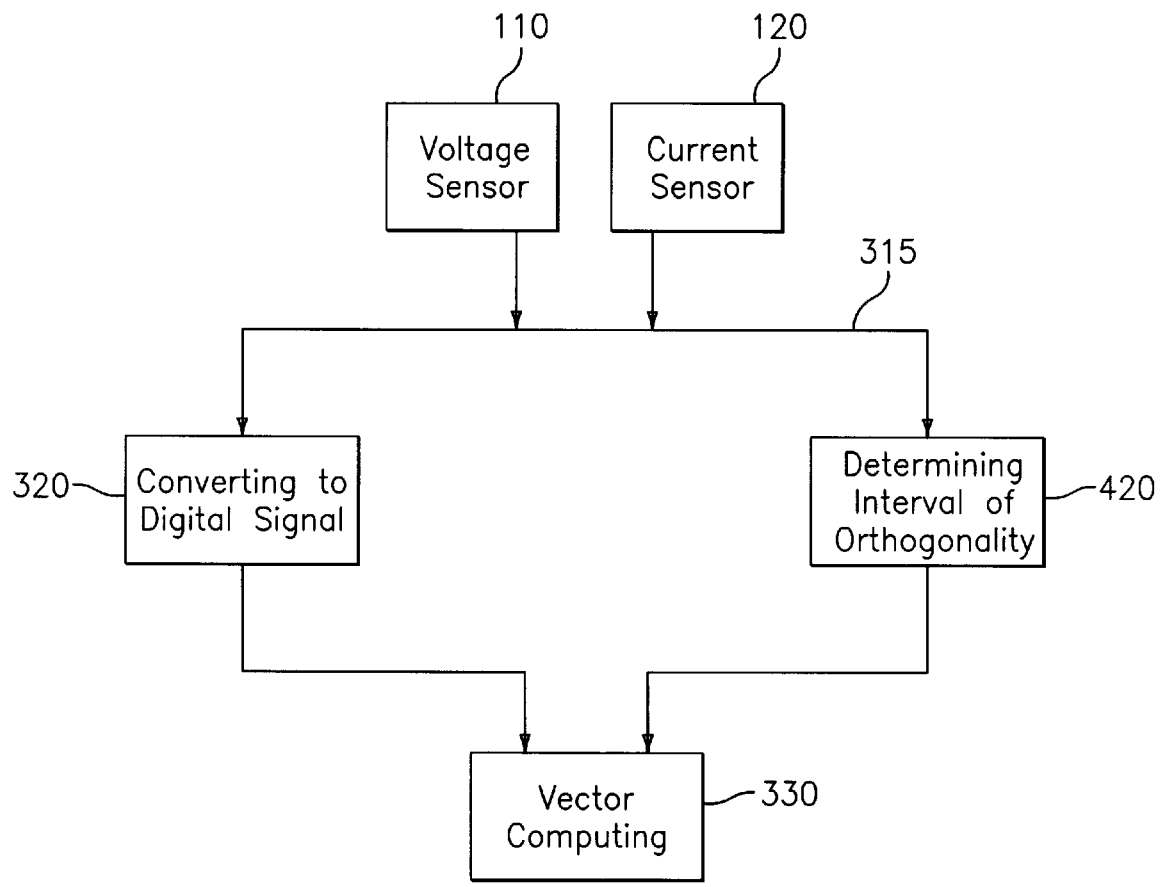
FIG. 4 is a block diagram illustrating operations in a vector electricity meter according to the present invention.

FIG. 4 illustrates the vector electricity meter of FIGS. 1 and 3A, with the addition of interval determining means 420 for determining an interval of orthogonality for voltage and current signals on the power line. As discussed above, vector power computations are performed over an interval of orthogonality for voltage and current signals on the power line. Vector computing means 330 may compute a vector metering quantity for the interval of orthogonality determined by interval determining means 420.

Figure 5:
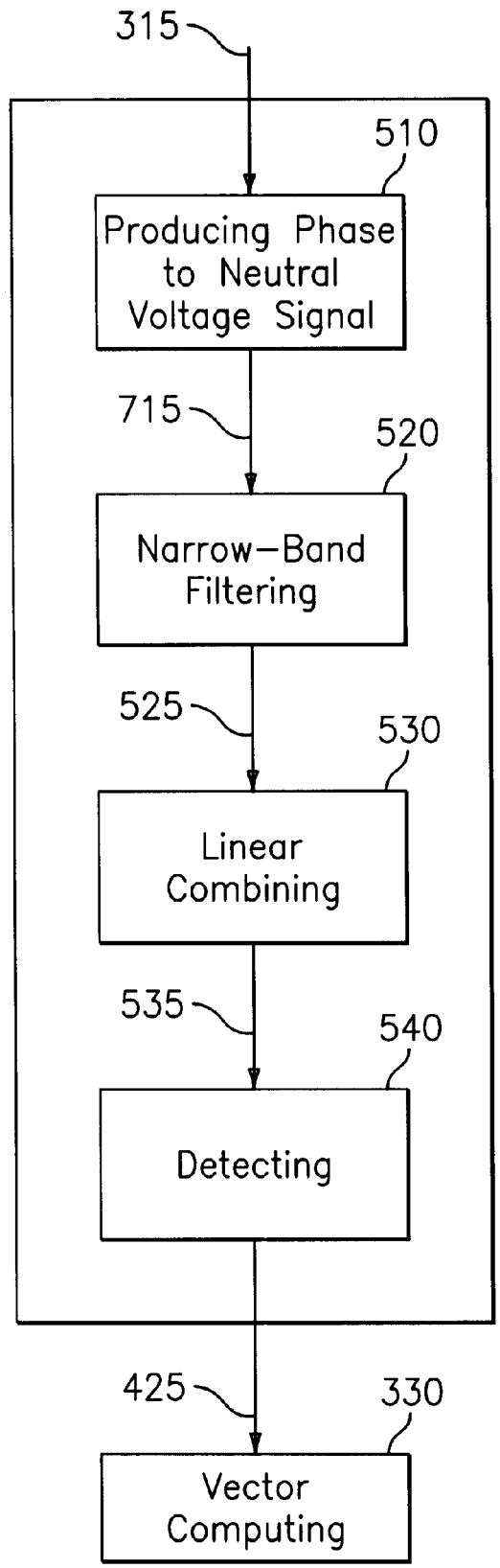
FIG. 5 is a block diagram illustrating determination of an interval of orthogonality according to the present invention.

FIG. 5 illustrates operations to determine an interval of orthogonality from the sensed voltage and current signals 315 for use by vector computing means 330. A fundamental frequency reference signal 535 is produced having a frequency approximately equivalent to the fundamental frequency of the sensed line voltage and current signals 315. In order to produce the fundamental frequency reference signal 535, a phase-to-neutral voltage signal 715 defining a phase of the power line is produced from the sensed line voltage signals 315 in producing means 510. The digital phase-to-neutral voltage signal for each phase is input to a narrow-band filter 520 preferably having a passband approximately centered on the nominal fundamental frequency of the power line to produce a fundamental frequency voltage signal 525.

The fundamental frequency voltage signals 525 produced are combined in linear combining means 530, which perform a weighted combination of the signals. Preferably, a first fundamental frequency voltage signal is scaled by approximately one-half, a second fundamental frequency voltage signal is scaled by approximately one-fourth and a third fundamental frequency voltage signal is scaled by approximately one-eighth, and the scaled signals summed to produce the fundamental frequency reference signal 535. The resulting signal has approximately the same fundamental frequency as the fundamental frequency voltage signals 525, and remains present even if one of the fundamental frequency voltage signals is not present, as in cases such as, for example, metering a three-wire single phase power line or a three-phase power line for which one line voltage is missing.

For a power line characterized by a fundamental frequency and multiple harmonics thereof, a common interval of orthogonality for the voltages and currents on the power line is an interval equivalent to an integral number of cycles of the lowest frequency component, i.e., an integral number of cycles of the fundamental. Thus, an interval of orthogonality for the power line may be determined by detecting means 540 detecting the passage of a predetermined number of cycles of the digital fundamental frequency reference signal 535. Preferably, the predetermined number of cycles of the fundamental frequency reference signal 535 used to determine the interval of orthogonality is such that a long enough interval is provided to allow computations for each interval to be completed before computations for the succeeding interval commence, without making the interval so long as to cause various accumulations performed in vector computing means 330 to overflow. Typically, for a nominal 60 Hz power line, 60 cycles of the fundamental frequency reference signal 535, or nominally one second, define an interval of orthogonality according to the present invention. Similarly, for a nominal 50 Hz power line, 50 cycles of the fundamental frequency reference signal 535 define an interval. It will be understood by those skilled in the art that other integral numbers of cycles of the fundamental frequency reference signal 535 may be used with the present invention, however.

It will be understood by those skilled in the art that functions of producing means 510, narrow-band filtering means 520, linear combining means 530 and detecting means 540 may be integrated with vector computing means 330, for example, in the digital signal processor 130 of FIG. 1. Those skilled in the art will also understand that these elements may also be implemented separately in analog circuits, digital circuits and combinations thereof. For example, producing means 510 may include a resistor network, narrow-band filter 520 may include an analog bandpass filter, linear combining means 530 may include analog arithmetic circuits and detecting means 540 may include an analog zero-crossing detector and associated counter which provides an interrupt or other signal to vector computing means 330 to indicate an interval of orthogonality.

Computing Power-Related Vector Metering Quantities

Figure 6:
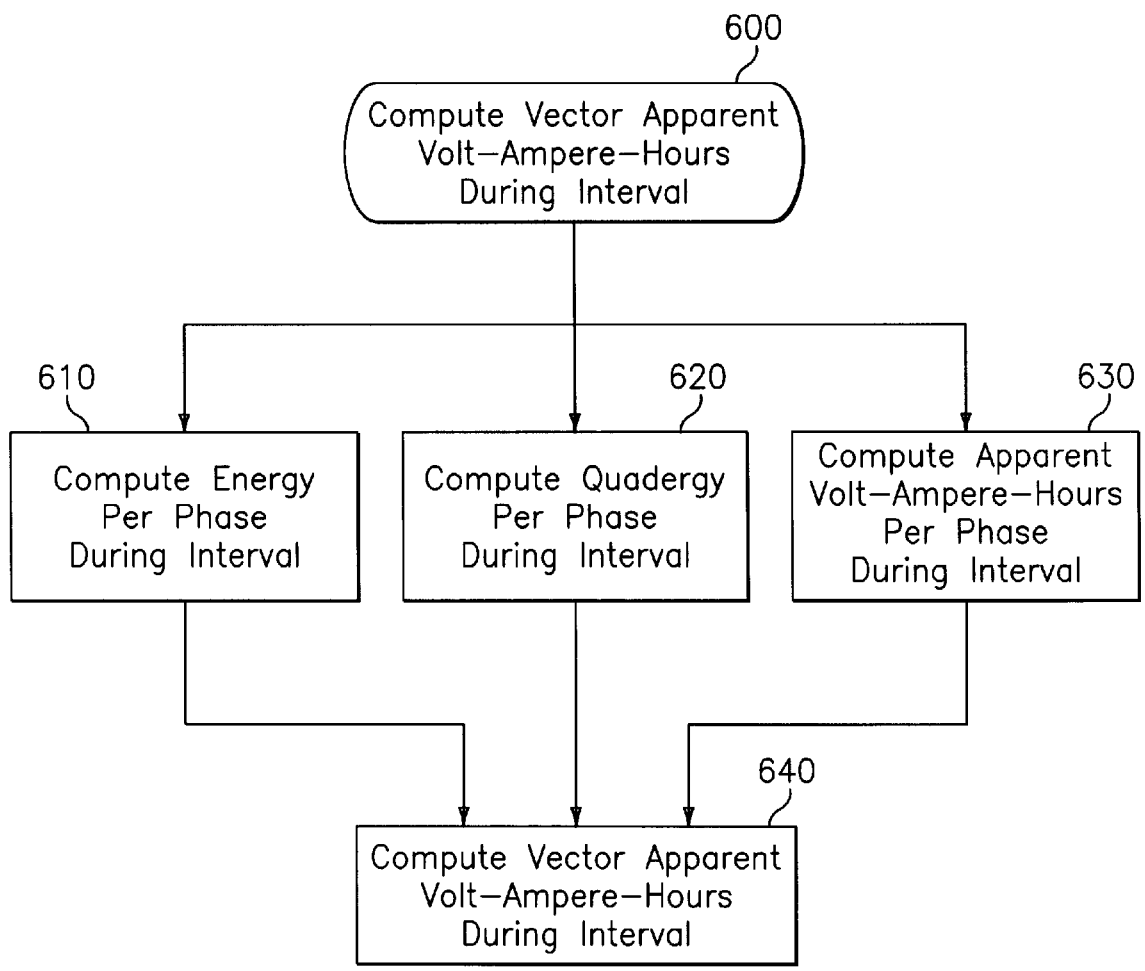
FIG. 6 is a block diagram illustrating computation of a vector metering quantity from sensed line voltage and current signals according to the present invention.

Having described a vector electricity meter and basic operations thereof, this section illustrates the computation of various power-related vector metering quantities in the vector computing means 330 of FIGS. 1 and 3A. As an example of computing a power-related vector metering quantity, FIG. 6 illustrates basic operations for computing vector apparent power for an interval of orthogonality from energy, quadergy and apparent volt-ampere-hours computed for each phase of the power during the interval. FIGS. 10, 11, 13 and 14 illustrate detailed operations for computing energy per phase, quadergy per phase, apparent volt-ampere-hours per phase, and vector apparent volt-ampere-hours for the power line during the interval, respectively. FIGS. 12A–12B illustrate a reactive power filter for computing quadergy per phase according to the present invention, and operations for implementing the reactive filter in vector computing means 330.

Referring to FIG. 6, energy per phase, quadergy per phase, and apparent volt-ampere-hours per phase are computed for the interval of orthogonality at Blocks 610, 620, 630, respectively. Vector apparent volt-ampere-hours for the power line for the intrreval are computed at Block 640 from the computed energy, quadergy, and apparent volt-ampere-hours for the phases. Typically, distortion volt-ampere hours are computed from the computed energy, quadergy, and apparent volt-ampere-hours per phase:

$$\text{DistortionVAh} = \sqrt{(\text{ApparentVAh})^2 - (\text{Energy})^2 - (\text{Quadergy})^2}.$$

Energy, quadergy and distortion volt-ampere-hours for the power line during the interval may be computed by summing the computed energy, quadergy and distortion volt-ampere-hours per phase. Vector apparent volt-ampere-hours for the power line during the interval may be computed from the computed energy, quadergy and distortion volt-ampere-hours. Those skilled in the art will understand, however, that although these computations may be performed individually, they may also be combined in composite computations.

Figure 10:
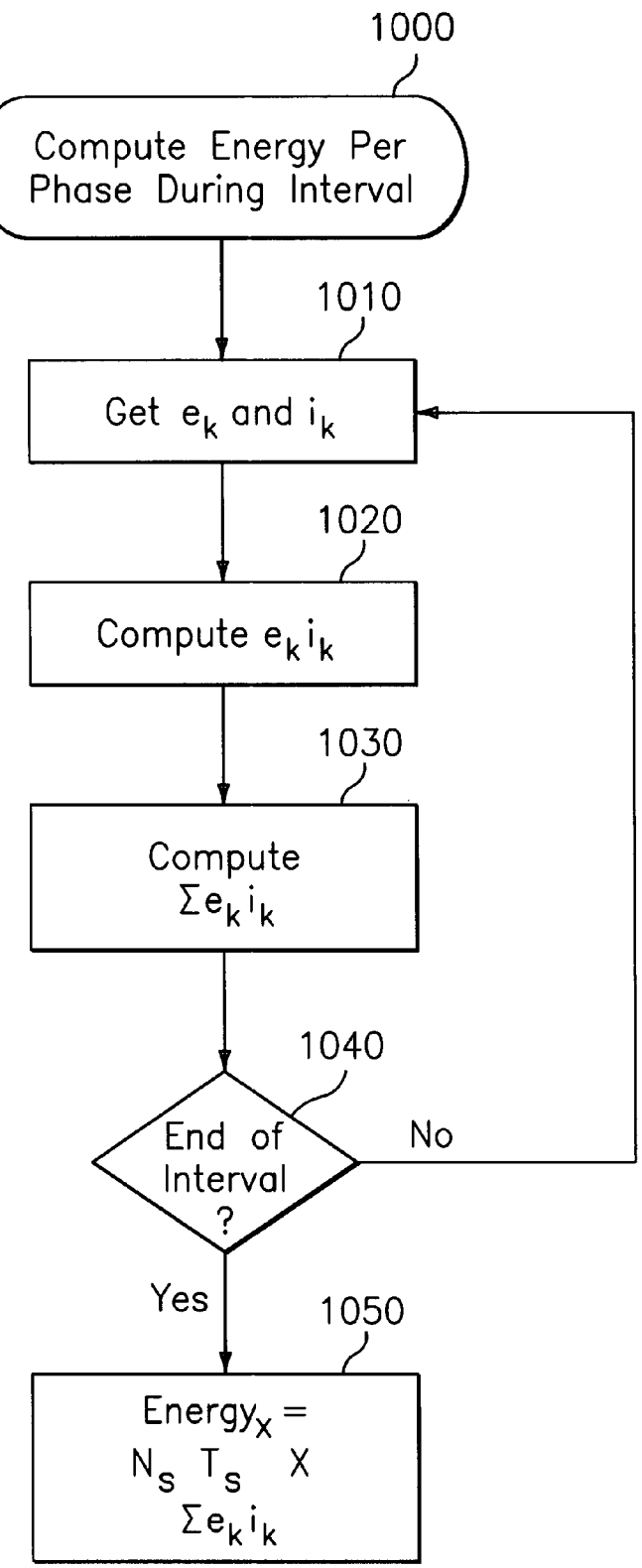
FIG. 10 is a block diagram illustrating operations for computing energy per phase during an interval of orthogonality according to the present invention.

FIG. 10 illustrates operations to compute energy per phase for an interval of orthogonality according to the present invention (Block 1000). A digital phase-to-neutral voltage sample $e_k$ obtained at Block 1010 is multiplied by the corresponding digital phase current sample $i_k$ at Block 1020. The product of the voltage and current samples for each sampling time is accumulated at Block 1030. After the end of the interval of orthogonality at Block 1040, the accumulated product of the voltage and samples is multiplied by the number of samples $N_s$ and the sampling interval $T_s$ to compute the energy transferred by the power line during the interval of orthogonality at Block 1050.

Figure 11:
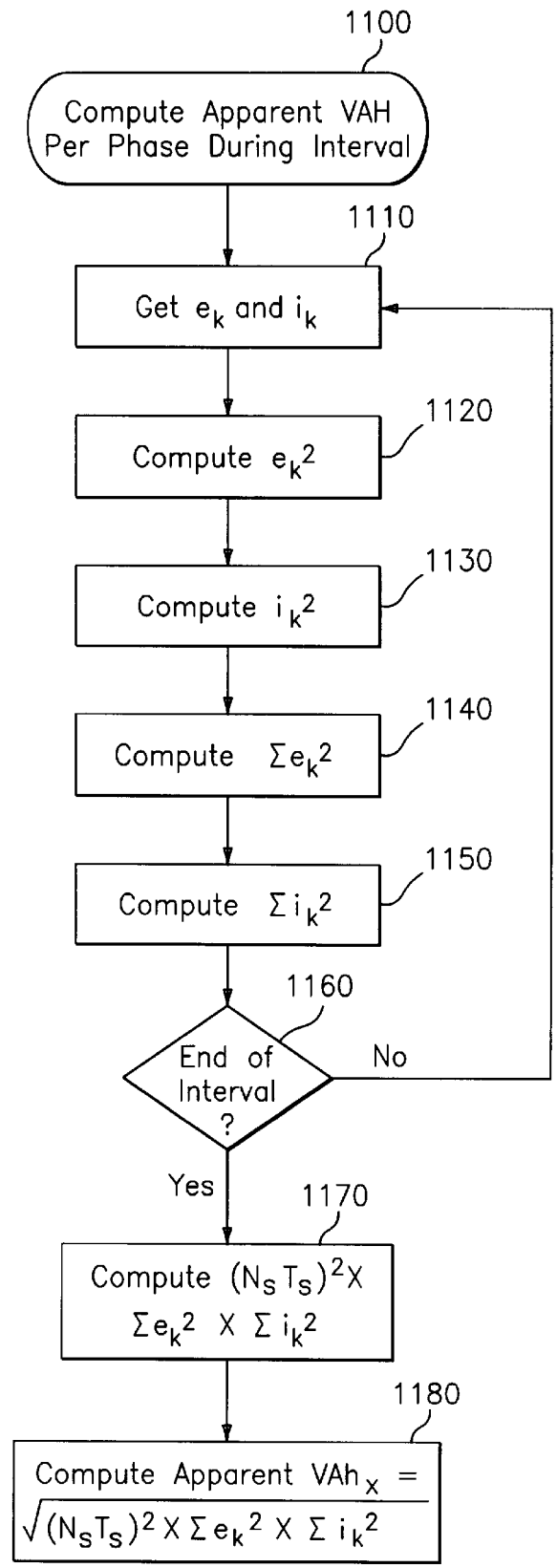
FIG. 11 is a block diagram illustrating operations for computing apparent volt-ampere-hours per phase for an interval of orthogonality according to the present invention.

FIG. 11 illustrates operations to compute apparent volt-ampere-hours per phase according to the present invention (Block 1100). A digital phase-to-neutral voltage sample $e_k$ obtained at Block 1110 is squared at Block 1120, and the resulting product is added at Block 1140 to a sum of the previous squared digital phase-to-neutral voltage samples. Similarly, a digital phase current sample $i_k$ obtained at Block 1110 is squared at Block 1130 and the resulting product accumulated at Block 1150. After the end of an interval at Block 1160, the accumulated squared digital phase-to-neutral voltage samples and the accumulated square digital phase current samples for each phase from the interval are multiplied at Block 1170 by the square of the number of samples $N_s$ times the sampling interval $T_s$ to produce a quantity equivalent to the square of the apparent volt-ampere-hours for the phase during the interval of orthogonality. The apparent volt-ampere-hours for the phase during the interval is computed at Block 1180 by taking the square root of this product.

FIG. 12A illustrates a reactive power filter 1210 for computing reactive power according to the present invention. It will be understood by those skilled in the art that in order to accurately measure reactive power of a phase for all significant harmonics using a phase-shifted form of a phase voltage signal to multiply a corresponding phase current signal, the phase voltage signal must be shifted equally for all of those harmonics. Conventional varhour meters typically cannot achieve such a uniform shift, usually correctly shifting only the fundamental and certain other frequency components A uniform phase shift is achieved according to the present invention for a desired frequency band by inputting the phase voltage signal E and the phase current signal I into a reactive power filter 1210. First phase-shifting filter $H_1$ and second phase-shifting filter $H_3$ preferably are recursive digital filters which induce a first phase shift $\delta_1$. Similarly, second phase-shifting filter $H_2$ and fourth phase-shifting filter $H_4$ similarly preferably are recursive digital filters which induce a second phase shift $\delta_2$. The outputs from each of these filters are multiplied as shown and summed to produce an output signal Q', which represents a product of a function of frequency and the reactive power Q:

$$e(t) \rightarrow E \angle \alpha;$$

$$i(t) \rightarrow I \angle \beta;$$

$$H_1(f)=H_3(f)=G_1 \angle \delta_1;$$

$$H_2(f)=H_4(f)=G_2 \angle \delta_2;$$

$$A=G_1G_2[EI \cos(\beta-\alpha)\cos(\delta_2-\delta_1)-EI \sin(\beta-\alpha)\sin(\delta_2-\delta_1)];$$

$$A=G_1G_2[P \cos(\delta_1-\delta_2)-Q \sin(\delta_1-\delta_2)];$$

$$B=G_1G_2[EI \cos(\beta-\alpha)\cos(\delta_1-\delta_2)-EI \sin(\beta-\alpha)\sin(\delta_1-\delta_2)];$$

$$B=G_1G_2[P \cos(\delta_1-\delta_2)+Q \sin(\delta_1-\delta_2)];$$

and $$Q'=GB-GA=2GG_1G_2 \sin(\delta_1-\delta_2)Q.$$

It will be understood by those skilled in the art that if $G_1$, $G_2$ and G are unity, the result reduces to:

$$Q'=2 \sin(\delta_1-\delta_2)$$

or $$Q'=g(f)Q.$$

Transfer characteristics for the function g(f)/2 is shown in FIG. 12B. The transfer functions of the phase-shifting filters $H_1$, $H_2$, $H_3$ and $H_4$ are chosen such that the phase difference closely approximates 90 degrees over a band of frequencies $\Delta f$, thus making the sine of the phase difference $\delta_1-\delta_2$ approximately unity and the output of the filter Q' a close approximation of the reactive power over the frequency range. Preferably, $\Delta f$ spans the range of significant harmonics of the fundamental frequency of the phase voltage and current signals preferably up to and including the twenty-third harmonic. Output Q' may be integrated to yield an accurate measurement of quadergy.

Those skilled in the art will understand that the reactive power filter 1210 may be implemented using analog circuitry, specialized digital circuitry or by software running on general-purpose processors. FIG. 13 illustrates operations for implementing the reactive power filter 1210 of FIG. 12A, which may be performed in the vector computing means 330 of FIG. 3A (Block 1300). A first phase-shifting filter is applied to a digital phase-to-neutral voltage sample $e_k$ obtained at Block 1305 to compute a first phase-shifted digital phase-to-neutral voltage sample $e_k'$ at Block 1310. A second phase-shifting filter is also applied to she digital phase-to-neutral voltage sample $e_k$ to compute a second phase-shifted digital phase-to-neutral voltage sample $e_k''$ at Block 1315. Similarly, a third phase-shifting filter having the same transfer function as the first phase-shifting filter is applied to a corresponding digital phase current sample $i_k$ obtained at Block 1305 to compute a first phase-shifted digital phase current sample $i_k'$ at Block 1320. A fourth phase-shifting filter having the same transfer function as the second phase-shifting filter is also applied to the digital phase current sample $i_k$ to compute a second phase-shifted digital phase current sample $i_k''$ at Block 1325.

The second phase-shifted digital phase-to-neutral voltage sample is multiplied by the first phase-shifted phase current sample to compute a first intermediate power sample $q_k'$ at Block 1330, and the first phase-shifted digital phase-to-neutral voltage sample is multiplied by the second phase-shifted phase current sample to compute a second intermediate power sample $q_k''$ at Block 1335. The second intermediate power sample is subtracted from the first intermediate power sample to compute a reactive power sample $q_k$ at Block 1340. The reactive power samples are accumulated at Block 1345. At the end of the interval at Block 1350, the accumulated reactive power samples are multiplied at Block 1355 by the number of samples $N_s$ and the sampling interval $T_s$ to compute the quadergy for the phase during the interval.

FIG. 14 illustrates detailed operations to compute vector apparent volt-ampere-hours from the computed energy, quadergy and apparent volt-ampere-hours for the phases of the power line (Block 1400). At the end of an interval of orthogonality at Block 1410, the accumulated energy and quadergy for each defined phase of the power line are subtracted as vectors at Block 1420 from the apparent volt-ampere-hours for the phase for the interval to compute the distortion volt-ampere-hours for the phase for the interval. Energy, quadergy and distortion volt-ampere-hours are computed for power line by summing at Blocks 1430, 1440 and 1450, respectively, the computed values for these quantities for all the phases of the power line. Vector apparent volt-ampere-hours is computed at Block 1460 as the square root of the sum of the squares of the energy, quadergy and distortion volt-ampere-hours.

According to the present invention, vector metering quantities computed using the vector computing means 330 of FIG. 3A may include energy, quadergy, distortion power, and corresponding per phase metering quantities. As will be understood by those skilled in the art, various power factors such as a power factor, a distortion power factor and the like may also be computed from ratios of the various metering quantities.

Vector computing means 330 may also compute related power quantities. Vector computing means 330 preferably stores the number of samples taken during an interval of orthogonality, thus providing a measure of the length of the interval. Vector apparent power may be computed from the vector apparent volt-ampere-hours computed for the interval of orthogonality by dividing the computed vector apparent volt-ampere-hours by the length of the interval. Similarly, active power may be computed from the computed energy for the interval by dividing the computed energy by the length of the interval and reactive power may be computed from the computed quadergy by dividing the computed quadergy by the length of the interval.

It will be understood by those skilled in the art that the computation of vector metering quantities in vector computing means 330 is not limited to the computing steps of the illustrated embodiments. For instance, according to the present invention, vector apparent power may be computed without first computing vector apparent volt-ampere-hours by first computing active, reactive and distortion power for the interval of orthogonality from the energy, quadergy and apparent volt-ampere-hours for the phases of the power line, and then vector summing these components. Vector apparent volt-ampere-hours may be computed from vector apparent power for the orthogonal interval by multiplying the computed vector apparent power for the interval by the number of samples in the interval.

Electric utilities often bill their customers based on energy plus an additional quantity, such as quadergy or phasor volt-ampere-hours. Typically, a "detent" is also applied to the measurement of these quantities, e.g., the utility may choose to bill only for delivered energy, for both delivered and received energy, lagging quadergy, and the like. Vector computing means 330 may compute an identified vector metering quantity to be metered. The identified metering quantity may be identified to vector computing means 330 for example, by a metering technician through the communications interface 170 illustrated in FIG. 1. Those skilled in the art will understand that the identified quantity may include an associated detent, such as leading quadergy only, received and delivered energy, and the like.

Computing Other Vector Metering Quantities

The vector computing means 330 illustrated in FIG. 3A may also compute other vector metering quantities useful for power system safety and maintenance, meter installation and the like, such as a phase angle, an effective line voltage, an expected nominal operating voltage, a line voltage status, a neutral current magnitude, and a neutral current status. FIGS. 15A–15B illustrate operations for computing a phase angle of a sensed line voltage 315 with respect to the fundamental frequency reference signal 535 of FIG. 5. FIGS. 16A–B illustrate operations for computing an effective line voltage and an expected nominal operating voltage. FIG. 17 illustrates operations for using the computed effective line voltage to compute a line voltage status. Finally, FIG. 18 illustrates operations for computing a neutral current magnitude and a neutral current status.

Operations for determining a phase angle of a sensed line voltage signal 315 with respect to the fundamental frequency reference signal 535 (see FIG. 5) are illustrated in FIGS. 15A–15B. Digital line voltage samples obtained at Block 1510 are narrow-band filtered at Block 1520 to compute a series of digital fundamental frequency line voltage samples representing a fundamental frequency component signal of the sensed line voltage signal. A set of migratory decimated digital line voltage samples are selected at Block 1530, one each from a succession of cycles of the fundamental frequency reference signal 535.

In particular, as illustrated in FIG. 15B, each migratory decimated sample is selected such that it comes from a sampling time delayed a predetermined decimation interval $N_1$ from the previous decimated sample with respect to the fundamental frequency reference signal 535. Preferably, the first decimated sample $e_{d1}$ is the first sample following the start of the interval of orthogonality, illustrated in FIG. 18B as following a first zero crossing of the fundamental frequency reference signal 535. The next decimated sample $e_{d2}$ is selected from samples taken during the next cycle of the fundamental frequency reference signal 535, delayed the decimation interval $N_1$ from the point on the waveform of the fundamental frequency reference signal 535 where the preceding sample $e_{d1}$ was selected.

Preferably, the decimation interval $N_1$ is such that the set of decimated samples selected during an interval of orthogonality approximately represent a period of the fundamental frequency component signal of the sensed line voltage signal 315. For a 60 Hz power line sampled at 3900 samples per second, for example, approximately 65 samples are taken in a cycle. If the migratory decimated samples are selected from successive cycles of the fundamental frequency reference signal 535 such that each is delayed a decimation interval $N_1$ of 13 samples from the preceding sample with respect to the fundamental frequency reference signal, a set of 5 decimated samples may be selected during an interval of 60 cycles of the fundamental frequency reference signal 535, thus approximating a period of the fundamental frequency component signal of the sensed line voltage 315. For a 50 Hz system at the same sampling rate and decimation interval $N_1$, the waveform may be represented by 6 samples.

The phase angle of the fundamental component of the line voltage may be computed after an interval of orthogonality at Block 1540 using Fourier analysis at Block 1550. Those skilled in the art will understand that $$\theta = \tan^{-1}\left(\frac{E_C}{E_S}\right)$$

where $$E_C = \frac{2}{M} \sum_{k=0}^{M-1} e_{dk} \cos \frac{2\pi k N_C N_1 N_S}{F_S^2}$$

and $$E_S = \frac{2}{M} \sum_{k=0}^{M-1} e_{dk} \sin \frac{2\pi k N_C N_1 N_S}{F_S^2}$$

are the cosine and sine terms, respectively, of the Fourier series representation of the fundamental frequency component signal of the sensed line voltage signal 315, based on M migratory decimated samples. For these equations, $N_s$ is the number of samples taken during an interval of orthogonality, $N_c$ is the nominal fundamental frequency of the power line (50 or 60 Hz), $N_1$ is the decimation interval, and $f_s$ is the sampling frequency.

The vector computing means 330 of FIGS. 1 and 3A may also compute an effective line voltage and a nominal expected operating voltage for the power line from a sensed line voltage signal 315, and monitor the sensed line voltage signals 315 based on the computed expected nominal operating voltage. Operations for computing an expected nominal operating voltage are illustrated in FIG. 16A (Block 1600). The effective voltage of a sensed line voltage signal 315 is computed at Block 1610 for an interval of orthogonality, preferably soon after or during an initialization of vector computing means 330. A phase angle for the line voltage may also be computed at Block 1500, also preferably during an initialization or soon thereafter. The expected nominal operating voltage is selected at Block 1620 from predetermined nominal operating voltages 1630 based on the computed effective voltage and the computed phase angle. Preferably, the selected expected nominal operating voltage is the predetermined nominal operating voltage 1630 closest to the computed effective voltage. The predetermined nominal operating voltages 1630 preferably include standard line voltages such as 120 volts, 240 volts, 277 volts and the like.

The expected nominal operating voltage may also be computed based on the computed phase angle. For example, the computed effective voltage may fall approximately equally between two predetermined nominal operating voltages, such as 240 volts and 277 volts, which typically correspond to a three-wire single phase service and a four-wire three phase wye service, respectively. As will be understood by those skilled in the art, these two circuit topologies may be differentiated by the different phase angles between the line voltages, i.e., the line voltages in the 277 volt service typically will be separated by a nominal phase angle of 120 degrees while the line voltages of the 240 volt service typically are separated by a nominal 60 degrees. Vector computing means 330 may compute the expected nominal operating voltage by selecting the predetermined nominal operating voltage having a phase angle characteristic closest to the computed phase angle.

FIG. 16B illustrates detailed operations for computing an effective line voltage (Block 1610). Line voltage samples obtained at Block 1611 are narrow-band filtered at Block 1612, the filtered samples squared at Block 1613, and the squared samples accumulated at Block 1614. After the end of the interval at Block 1615, the effective voltage during the interval is computed by taking the square root of the accumulated digital line squared voltage samples divided by the number of samples $N_s$ times the sampling interval $T_s$ at Block 1616.

Referring now to FIG. 17, the computed expected nominal line voltage may be used to compute at a line voltage status (Block 1700). At Block 1710 an effective line voltage is computed. The computed line voltage status is compare to an expected nominal operating voltage, based on predetermined tolerance 1740, to compute a line voltage status at Block 1720. It will be understood by those skilled in the art that although the status computed preferably relates to an overvoltage or undervoltage condition on the power line, other line voltage status may be computed, such as statistical deviation of the computed effective voltage with respect to the expected nominal operating voltage and the like. It will also be understood that the computed status may be communicated from vector computing means 330 to a user, a switchgear control system, and the like, for maintenance, shutdown and other purposes, for example, through the communications interface 170 or display 160 of FIG. 1. It will be also be understood that effective line voltage and line voltage status may be computed at every interval of orthogonality or at other predetermined intervals.

Referring now to FIG. 18, vector computing means 330 may also compute and monitor a neutral current magnitude from computed digital phase current samples (Block 1800). Digital phase current samples obtained for each phase at Block 1810 are summed at Block 1820 and the sum squared at Block 1830. The neutral current magnitude is computed by taking the square root of the squared sum at Block 1830. A neutral current status may be computed at Block 1840 by comparing the computed neutral current magnitude to a predetermined threshold 1842. It will be understood by those skilled in the art that the computed status may be communicated to a user, a switchgear control system, and the like, for maintenance, shutdown and other purposes. It will also be understood that neutral current magnitude and status may be computed at every sample time, at every interval of orthogonality, or at other predetermined intervals.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method for measuring reactive power for an electrical power line, comprising the steps of:

sensing a voltage signal and a current signal on the power line;

phase-shifting the voltage signal according to a first phase shift to obtain a first phase-shifted voltage signal;

phase-shifting the voltage signal according to a second phase shift to obtain a second phase-shifted voltage signal;

phase-shifting the current signal according to the first phase shift to obtain a first phase-shifted current signal;

phase-shifting the current signal according to the second phase shift to obtain a second phase-shifted current signal;

multiplying the first phase-shifted voltage signal by the second phase-shifted current signal to obtain a first intermediate power product signal;

multiplying the second phase-shifted voltage signal by the first phase-shifted current signal to obtain a second intermediate power product signal; and summing the first intermediate power product signal and the second intermediate power product signal to obtain an output signal representing reactive power for the power line over a predetermined frequency range.

2. A method according to claim 1:

wherein said step of phase-shifting the voltage signal according to a first phase shift comprises the step of applying a first phase-shifting filter having a first phase-versus-frequency transfer function to the voltage signal to obtain a first phase-shifted voltage signal;

wherein said step of phase-shifting the voltage signal according to a second phase shift comprises the step of applying a second phase-shifting filter having a second phase-versus frequency transfer function to the voltage signal to obtain a second phase-shifted voltage signal, the second phase-versus-frequency transfer function differing from the first phase-versus-frequency transfer function by approximately 90 degrees over the predetermined frequency range;

wherein said step of phase-shifting the current signal according to the first phase shift comprises the step of applying a third phase-shifting filter having the first phase-versus-frequency transfer function to the current signal to obtain a first phase-shifted current signal; and wherein said step of phase-shifting the current signal according to the second phase shift comprises the step applying a fourth phase-shifting filter having the second phase-versus-frequency transfer function to the phase-to-neutral current signal to obtain a second phase-shifted current signal.

3. A system for measuring reactive power for an electrical power line, comprising:

a voltage sensor which senses a voltage on the power line;

a current sensor which senses a current signal on the power line;

first phase-shifting means, responsive to said voltage sensor, for phase-shifting the voltage signal according to a first phase shift to obtain a first phase-shifted voltage signal;

second phase-shifting means, responsive to said voltage sensor, for phase-shifting the voltage signal according to a second phase shift to obtain a second phase-shifted voltage signal;

third phase-shifting means, responsive to said current sensor, for phase-shifting the current signal according to the first phase shift to obtain a first phase-shifted current signal;

fourth phase-shifting means, responsive to said current sensor, for phase-shifting the current signal according to the second phase shift to obtain a second phase-shifted current signal;

a first multiplier, responsive to said first phase-shifting means and to said fourth phase-shifting means, which multiplies the first phase-shifted voltage signal by the second phase-shifted current signal to obtain a first intermediate power product signal;

a second multiplier, responsive to said second phase-shifting means and to said third phase-shifting means, which multiplies the second phase-shifted voltage signal by the first phase-shifted current signal to obtain a second intermediate power product signal; and an adder, responsive to said first multiplier and to said second multiplier, which sums the first intermediate power product signal and the second intermediate power product signal to obtain an output signal representing reactive power for the power line over a predetermined frequency range.

4. A system according to claim 3:

wherein said first phase-shifting means comprises a first phase-shifting filter having a first phase-versus-frequency transfer function;

wherein said second phase-shifting means comprises a second phase-shifting filter having a second phase-versus frequency transfer function, the second phase-versus-frequency transfer function differing from the first phase-versus-frequency transfer function by approximately 90 degrees over the predetermined frequency range;

wherein said third phase-shifting means comprises a third phase-shifting filter having the first phase-versus-frequency transfer function; and wherein said fourth phase-shifting means comprises a fourth phase-shifting filter having the second phase-versus-frequency transfer function.

5. A system according to claim 4:

wherein said first phase-shifting filter comprises a first recursive digital filter having a first phase-versus-frequency transfer function;

wherein said second phase-shifting filter comprises a second recursive digital filter having a second phase-versus frequency transfer function, the second phase-versus-frequency transfer function differing from the first phase-versus-frequency transfer function by approximately 90 degrees over the predetermined frequency range;

wherein said third phase-shifting filter comprises a third recursive digital filter having the first phase-versus-frequency transfer function; and wherein said fourth phase-shifting filter comprises a fourth recursive digital filter having the second phase-versus-frequency transfer function.

* * * * *